US012324340B2

(12) United States Patent
Xu et al.

(10) Patent No.: US 12,324,340 B2
(45) Date of Patent: *Jun. 3, 2025

(54) DISPLAY SUBSTRATE AND DISPLAY DEVICE

(71) Applicants: Beijing BOE Technology Development Co., Ltd., Beijing (CN); BOE Technology Group Co., Ltd., Beijing (CN)

(72) Inventors: Chen Xu, Beijing (CN); Xueguang Hao, Beijing (CN); Yong Qiao, Beijing (CN); Xinyin Wu, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/596,678

(22) Filed: Mar. 6, 2024

(65) Prior Publication Data

US 2024/0215371 A1 Jun. 27, 2024

Related U.S. Application Data

(63) Continuation of application No. 17/265,815, filed as application No. PCT/CN2020/102161 on Jul. 15, 2020, now Pat. No. 11,963,420.

(30) Foreign Application Priority Data

Dec. 13, 2019 (CN) .......................... 201922237251.2

(51) Int. Cl.
*H10K 59/35* (2023.01)
*H10K 59/121* (2023.01)
*H10K 59/131* (2023.01)

(52) U.S. Cl.
CPC ....... *H10K 59/353* (2023.02); *H10K 59/1213* (2023.02); *H10K 59/1216* (2023.02); *H10K 59/131* (2023.02)

(58) Field of Classification Search
CPC ............... H10K 59/353; H10K 59/131; H10K 59/1213; H10K 59/1216
See application file for complete search history.

(56) References Cited

U.S. PATENT DOCUMENTS 5,371,405 A * 12/1994 Kagawa .................. H01L 23/66
257/532
11,963,420 B2 * 4/2024 Xu ...................... H10K 59/1216
(Continued)

FOREIGN PATENT DOCUMENTS

CN 104078486 A 10/2014
CN 104576653 A 4/2015
(Continued)

OTHER PUBLICATIONS

International Search Report for PCT/CN2020/102161 Mailed Oct. 19, 2020.
(Continued)

*Primary Examiner* — Timor Karimy
(74) *Attorney, Agent, or Firm* — Ling Wu; Stephen Yang; Ling and Yang Intellectual Property

(57) ABSTRACT

There is provided a display substrate and a display device. The display substrate includes a first metal layer, a first insulating layer, a metal oxide layer, a second insulating layer and a second metal layer which are stacked; wherein the metal oxide layer comprises a first pattern, a second pattern and a capacitance pattern, the first metal layer comprises a first electrode plate, there is at least a first overlapping region between the first electrode plate and the capacitance pattern to form a first storage capacitor, the second metal layer comprises a second electrode plate, there (Continued)

is at least a second overlapping region between the second electrode plate on the base substrate and the capacitance pattern to form a second storage capacitor, and the first electrode plate and the second electrode plate have same potential.

19 Claims, 10 Drawing Sheets

(56) References Cited

U.S. PATENT DOCUMENTS

| | | |
|---|---|---|
| 2006/0208977 A1 | 9/2006 | Kimura |
| 2012/0319114 A1* | 12/2012 | Yamazaki ......... H01L 29/78618 438/151 |
| 2014/0097411 A1 | 4/2014 | Choi |
| 2014/0291636 A1 | 10/2014 | Kim et al. |
| 2015/0102349 A1 | 4/2015 | Lee et al. |
| 2015/0279872 A1 | 10/2015 | Kato et al. |
| 2016/0056225 A1 | 2/2016 | Lee et al. |
| 2017/0345883 A1 | 11/2017 | Song et al. |
| 2018/0012549 A1* | 1/2018 | Lee ..................... G09G 3/3266 |
| 2018/0151114 A1 | 5/2018 | Choi et al. |
| 2018/0175077 A1 | 6/2018 | Koo et al. |
| 2019/0165183 A1 | 5/2019 | Terai |
| 2019/0206328 A1 | 7/2019 | Park |
| 2019/0206971 A1* | 7/2019 | Kim ..................... H10K 59/123 |
| 2021/0327984 A1 | 10/2021 | Han |
| 2021/0335956 A1 | 10/2021 | Zhang et al. |

FOREIGN PATENT DOCUMENTS

| | | |
|---|---|---|
| CN | 104681585 A | 6/2015 |
| CN | 107039465 A | 8/2017 |
| CN | 107452772 A | 12/2017 |
| CN | 108428730 A | 8/2018 |
| CN | 110098235 A | 8/2019 |
| JP | 2006140140 A | 6/2006 |
| JP | 2013021312 A | 1/2013 |
| JP | 2015191038 A | 11/2015 |
| JP | 2017182082 A | 10/2017 |
| JP | 2019102602 A | 6/2019 |
| WO | 2019218993 A1 | 11/2019 |

OTHER PUBLICATIONS

European Search Report for 20864329.6 Mailed Dec. 19, 2023.
Office Action dated Aug. 29, 2023 for U.S. Appl. No. 17/265,815.
Notice of Allowance dated Dec. 6, 2023 for U.S. Appl. No. 17/265,815.
Office Action dated Apr. 30, 2024 for Japanese patent application No. 2021-538033 and English translation.

* cited by examiner

DISPLAY SUBSTRATE AND DISPLAY DEVICE

CROSS-REFERENCE TO RELATED APPLICATIONS

The present application is a continuation of U.S. application Ser. No. 17/265,815 filed on Feb. 4, 2021, which is a U.S. National Phase Entry of International Application PCT/CN2020/102161 having an international filing date of Jul. 15, 2020, which claims priority of Chinese Patent Application No. 201922237251.2, filed to the CNIPA on Dec. 13, 2019, and entitle "Display Substrate and Display Device", the content of which should be interpreted as being incorporated into the present application by reference.

TECHNICAL FIELD

Implementations of the present disclosure relate to, but are not limited to, a technical field of display, in particular to a display substrate and a display device.

BACKGROUND

Organic Light Emitting Diode (OLED) display devices have the advantages such as ultra-thinness, large viewing angle, active light emission, high brightness, continuous and adjustable color of emitted light, low cost, fast response, low power consumption, wide operating temperature range and flexible display, and have gradually become a promising next generation display technology. According to different driving modes, OLED may be divided into two types, Passive Matrix (PM) driving type and Active Matrix (AM) driving type. AMOLED is a current driving device, and uses an independent Thin Film Transistor (TFT) to control each sub-pixel, wherein each sub-pixel may continuously and independently drive light emission.

For AMOLED, from data writing of one frame to data writing of the next frame, a gate electrode voltage of a driving transistor is maintained by a storage capacitor. Because of the leakage current of the transistor, the voltage stored in the storage capacitor will gradually decrease, which will cause the potential of the gate electrode of the transistor to change, and then affect current flowing through an organic electroluminescent diode and luminous brightness of the sub-pixel. For this reason, capacity of the storage capacitor is usually designed to be large enough to increase the duration of the voltage.

However, with the development of high-resolution (PPI) display technology, pixel size is getting smaller and smaller, and layout space is shrinking. As a result, the arrangement space of the storage capacitor is tighter, and the capacity increase of the storage capacitor is severely limited. Although some solutions have been proposed in related technologies, these solutions have a defect of decreasing display quality.

SUMMARY

The following is a summary of the subject matter described in detail in the present disclosure. This summary is not intended to limit the protection scope of the claims.

On one hand, the present disclosure provides a display substrate including a substrate and a plurality of sub-pixels corresponding to different colors arranged on the substrate, wherein each sub-pixel includes a pixel driving circuit and an organic electroluminescent diode electrically connected with the pixel driving circuit.

The pixel driving circuit includes a first transistor, a second transistor and a storage capacitor, a gate electrode of the first transistor is coupled to a first scanning line, a first electrode of the first transistor is coupled to a data line, and a second electrode of the first transistor is coupled to a gate electrode of the second transistor; a first electrode of the second transistor is coupled to a first power supply voltage line, a second electrode of the second transistor is coupled to a first electrode of the organic electroluminescent diode, and a second electrode of the organic electroluminescent diode is coupled to a second power supply voltage line; a first electrode of the storage capacitor is coupled to the gate electrode of the second transistor, a second electrode of the storage capacitor is coupled to the second electrode of the second transistor.

In a direction perpendicular to the substrate, the display substrate includes a first metal layer, a first insulating layer, a metal oxide layer, a second insulating layer and a second metal layer which are stacked.

The metal oxide layer includes a first pattern as an active layer of the first transistor, a second pattern as an active layer of the second transistor and a capacitor pattern as the first electrode of the storage capacitor. The metal oxide layer includes gallium.

The first metal layer includes a first electrode plate, and there is at least a first overlapping region between an orthographic projection of the first electrode plate on the substrate and an orthographic projection of the capacitor pattern on the substrate to form a first storage capacitor.

The second metal layer includes a second electrode plate, and there is at least a second overlapping region between an orthographic projection of the second electrode plate on the substrate and the orthographic projection of the capacitor pattern on the substrate to form a second storage capacitor.

The first electrode plate and the second electrode plate have same potential.

In an exemplary implementation, there is an overlapping region between an orthographic projection of the second pattern on the substrate and the orthographic projection of the first electrode plate on the substrate.

In an exemplary implementation, there is further a gate insulating layer between the first insulating layer and the second insulating layer, wherein a thickness of the gate insulating layer is less than a thickness of the second insulating layer.

In an exemplary implementation, a thickness of the first insulating layer is less than sum of thicknesses of the gate insulating layer and the second insulating layer.

In an exemplary implementation, there is further a gate metal layer between the first metal layer and the second metal layer, wherein a thickness of the second metal layer is greater than a thickness of the gate metal layer.

In an exemplary implementation, a channel aspect ratio of the first transistor is less than a channel aspect ratio of the second transistor.

In an exemplary implementation, a voltage of the first power supply voltage line is greater than a voltage of the second power supply voltage line, a maximum voltage of the data line is less than a maximum voltage of the first scanning line, and the maximum voltage of the data line is less than the voltage of the first power supply voltage line.

In an exemplary implementation, an orthographic projection of the first pattern on the substrate and the orthographic projection of the capacitor pattern on the substrate are arranged apart, and the orthographic projection of the first pattern on the substrate and the orthographic projection of the first electrode plate on the substrate are arranged apart.

In an exemplary implementation, the first pattern and the capacitor pattern are in an integrated structure.

In an exemplary implementation, the pixel driving circuit further includes a third transistor wherein a gate electrode of the third transistor is coupled to a second scanning line, a first electrode of the third transistor is connected with a compensation line, and a second electrode of the third transistor is coupled to the second electrode of the second transistor.

In an exemplary implementation, the metal oxide layer further includes a third pattern as an active layer of the third transistor.

In an exemplary implementation, the second insulating layer covers the first scanning line, the second scanning line, the gate electrode of the first transistor, the gate electrode of the second transistor and the gate electrode of the third transistor; and a plurality of via holes are arranged on the second insulating layer respectively.

In an exemplary implementation, the second metal layer further includes the data line, the first power supply voltage line, a source electrode of the first transistor, a drain electrode of the first transistor, a source electrode of the second transistor, a drain electrode of the second transistor, a source electrode of the third transistor, and a drain electrode of the third transistor.

In an exemplary implementation, the source electrode of the first transistor and the data line are in an integrated structure, the source electrode of the second transistor and the first power supply voltage line are in an integrated structure, and the drain electrode of the second transistor, the drain electrode of the third transistor and the second electrode plate are in an integrated structure.

In an exemplary implementation, the capacitor electrode plate, the active layer of the first transistor, the active layer of the second transistor and the active layer of the third transistor are arranged on a same layer, made of a same material and formed by a same patterning process.

In an exemplary implementation, the second electrode plate, the data line, the first power supply voltage line, the first source electrode, the drain electrode of the first transistor, the source electrode of the second transistor, the drain electrode of the second transistor, the source electrode of the third transistor and the drain electrode of the third transistor are arranged in a same layer, made of a same material and formed by a same patterning process.

In an exemplary implementation, the metal oxide layer is a single layer, a double layer or a plurality of layers.

In an exemplary implementation, the metal oxide layer includes a first oxide layer and a second oxide layer stacked, wherein conductivity of the second oxide layer is lower than that of the first oxide layer, and a band gap width of the second oxide layer is greater than that of the first oxide layer.

In an exemplary implementation, the first oxide layer is configured to be close to the gate electrode of the first transistor, the gate electrode of the second transistor and the gate electrode of the third transistor.

In another aspect, the present disclosure further provides a display device including any of the above display substrates.

Other features and advantages of the present disclosure will be set forth in the following description, and in part will become apparent from the description, or be learned by practice of the present disclosure. Purposes and other advantages of the Implementations of the present disclosure may be achieved and obtained by structures specified in the specification, claims and drawings.

Other aspects will become apparent upon reading and understanding accompanying drawings and the detailed description.

BRIEF DESCRIPTION OF THE DRAWINGS

Accompanying drawings are used to provide a further understanding of technical solutions of the present disclosure, form a part of the specification, and explain technical solutions of the present disclosure together with Implementations of the present disclosure, while they do not constitute a limitation on the technical solutions of the present disclosure.

FIG. 2b is a sectional view taken along A-A in FIG. 2a.

FIG. 3b is a sectional view taken along A-A in FIG. 3a.

FIG. 4b is a sectional view taken along A-A in FIG. 4a.

FIG. 5b is a sectional view taken along A-A in FIG. 5a.

FIG. 6b is a sectional view taken along A-A in FIG. 6a.

FIG. 7b is a sectional view taken along A-A in FIG. 7a.

FIG. 8b is a sectional view taken along A-A in FIG. 8a.

FIG. 9b is a sectional view taken along A-A in FIG. 9a.

FIG. 10b is a sectional view taken along A-A in FIG. 10a;

DETAILED DESCRIPTION

Figure 1:
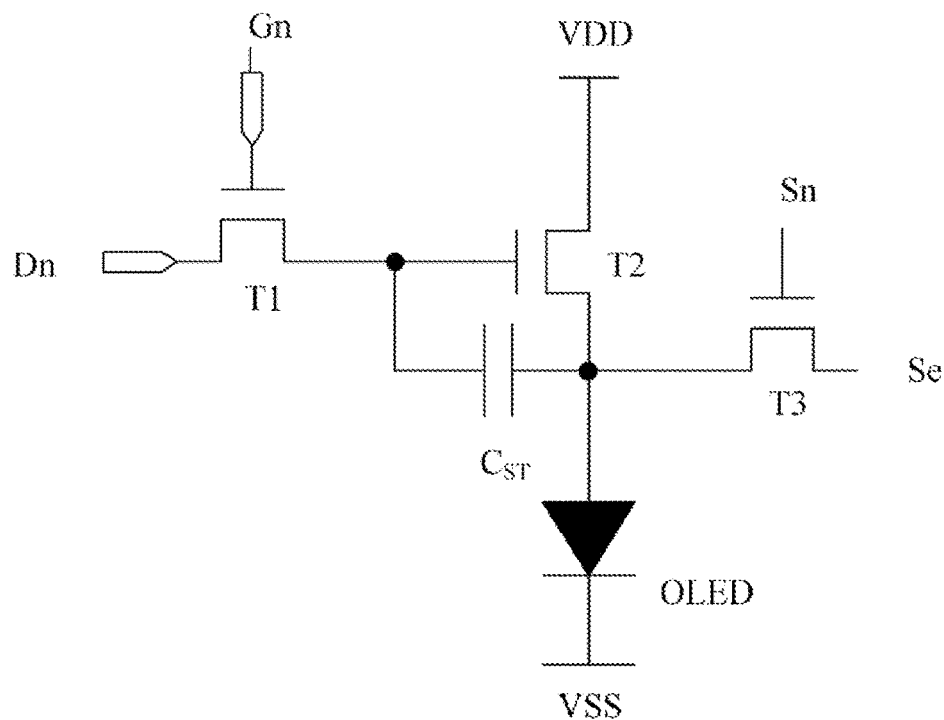
FIG. 1 is an equivalent circuit schematic diagram of an OLED pixel driving circuit.

Hereinafter, Implementations will be described with reference to the drawings. It should be noted that the Implementations may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following Implementations. It should be understood that the Implementations described below are only used to illustrate and explain the present disclosure, and are not used to limit the present disclosure. Furthermore, without a conflict, Implementations in the present disclosure and features in the Implementations may be combined with each other.

In the drawings, the size of each constituent element, or the thickness or area of a layer, is sometimes exaggerated for clarity. Therefore, an implementation of the present disclosure is not necessarily limited to the size shown, and shapes and sizes of the components in the drawings do not reflect true proportions. In addition, the drawings schematically show ideal examples, and an implementation of the present disclosure is not limited to the shapes or values shown in the drawings.

The "first", "second", "third" and other ordinal numbers in the present disclosure are used to avoid confusion of constituent elements, but not to limit in quantity.

In the present specification, for convenience, words indicating orientation or position relationship such as "middle", "upper", "lower", "front", "rear", "vertical", "horizontal", "top", "bottom", "inside" and "outside" or the like are used to indicate the position relationship of constituent elements with reference to the drawings, and this is only for case of description of the present specification and simplification of the description, rather than indicating or implying that the referred apparatus or element must have a specific orientation, or be constructed and operated in a particular orientation, and therefore this cannot be understood as a limitation on the present disclosure. The position relationship of the constituent elements is appropriately changed according to the direction in which each constituent element is described. Therefore, it is not limited to the words described in the present specification, and can be replaced as appropriate according to specific situations.

In the present disclosure, a transistor refers to an element including at least three terminals, namely, a gate electrode, a drain electrode and a source electrode. A transistor has a channel region between a drain electrode (drain terminal, drain region or drain electrode) and a source electrode (source terminal, source region or source electrode), and current can flow through the drain electrode, the channel region and the source electrode. In the present disclosure, the channel region refers to a region through which the current mainly flows.

The functions of the "source electrode" and the "drain electrode" are sometimes interchanged under the circumstance that transistors with opposite polarities are used or the circumstance that the current direction changes during circuit operation, or other circumstances. Therefore, in the present disclosure, "the source electrode" and "the drain electrode" can be exchanged with each other.

In the present specification, "electrical connection" includes a circumstance where the constituent elements are connected together through an element having a certain electrical action. The "element having a certain electrical action" is not particularly limited as long as it can transmit and receive electrical signals between connected constituent elements. Examples of the "element having a certain electrical action" include not only electrodes and wiring, but also switching elements such as transistors, resistors, inductors, capacitors, and other elements with various functions.

In the present disclosure, "parallel" refers to a state in which an angle formed by two straight lines is −10 degrees or more and 10 degrees or less, and thus also includes a state in which the angle is −5 degrees or more and 5 degrees or less. In addition, "vertical" refers to a state in which two straight lines form an angle of 80 degrees or more and 100 degrees or less, and thus also includes a state of an angle being 85 degrees or more and 95 degrees or less.

In the present disclosure, "film" and "layer" can be interchanged. For example, sometimes "conductive layer" may be replaced by "conductive film". Similarly, "insulating film" may sometimes be replaced by "insulating layer".

In the present disclosure, for example, when the conductivity is sufficiently low, sometimes "semiconductor" has characteristics of "insulator". In addition, because the boundary between "semiconductor" and "insulator" is not clear, it is sometimes impossible to accurately distinguish "semiconductor" from "insulator". Therefore, "semiconductor" in the present disclosure can sometimes be changed to "insulator". Similarly, "insulator" in the present disclosure can sometimes be changed to "semiconductor". In addition, "insulator" in the present disclosure can sometimes be changed to "semi-insulator".

In the present disclosure, for example, when the conductivity is sufficiently high, sometimes "semiconductor" has the characteristics of "conductor". In addition, because the boundary between "semiconductor" and "conductor" is not clear, it is sometimes impossible to accurately distinguish "semiconductor" from "conductor". Therefore, "semiconductor" in the present disclosure may sometimes be changed to "conductor". Similarly, "conductor" in the present disclosure may sometimes be changed to "semiconductor".

In the present disclosure, impurities of semiconductors refer to elements other than main components of semiconductors. For example, elements with a concentration lower than 0.1 atomic % % are impurities. If the semiconductor contains impurities, Density Of States (DOS) may be formed in the semiconductor, carrier migration rate may decrease or crystallinity may decrease. When the semiconductor includes an oxide semiconductor, examples of impurities that change the characteristics of the semiconductor include Group 1 elements, Group 2 elements, Group 14 elements, Group 15 elements, and transition metals other than the main components. Typical examples include hydrogen (contained in water), lithium, sodium, silicon, boron, phosphorus, carbon, and nitrogen. In oxide semiconductors, the incorporation of impurities such as hydrogen sometimes causes oxygen defects. In addition, when the semiconductor contains silicon, examples of impurities that change the characteristics of the semiconductor include oxygen, Group 1 elements other than hydrogen, Group 2 elements, Group 13 elements, and Group 15 elements.

At present, in the display substrate structure, usually, the overlapping parts of the gate electrode and the source electrode act as two electrode plates of the storage capacitor, and the gate insulating layer acts as the dielectric. In order to improve the CST capacity of the storage capacitor, measures such as increasing the overlapping region of the electrode plates, selecting materials with higher dielectric constant as the gate insulating layer or reducing the thickness of the gate insulating layer are usually adopted. However, the solution of increasing the overlapping region of electrode plates is not only contrary to the requirement of high resolution, but also reduces the design margin, which leads to the increase of process difficulty, the loss of yield and the reduction of display quality. In addition, the solution of selecting materials with higher dielectric constant as the gate insulating layer may improve the capacity of the storage capacitor, but in other areas of the display substrate, materials with high dielectric constant have a great influence on transistor performance, which will also reduce the display quality. In addition, the solution of reducing the thickness of the gate insulating layer not only adds the process flow, but also is incompatible with the self-aligned doping process, which will also reduce the display quality.

In order to effectively increase the capacity of the storage capacitor on the premise of ensuring the display quality, an embodiment of the present disclosure provides a display substrate. The display substrate includes a substrate. In a direction parallel to the substrate, the display substrate of the present disclosure includes a plurality of sub-pixels corresponding to different colors arranged on the substrate, wherein each sub-pixel includes a pixel driving circuit and an organic electroluminescent diode (OLED) electrically connected with the pixel driving circuit.

FIG. 1 is an equivalent circuit diagram of a pixel driving circuit according to an embodiment of the present disclosure. As shown in FIG. 1, the pixel driving circuit includes a first transistor T1, a second transistor T2, a third transistor T3 and a storage capacitor CST. The first transistor T1 is a switching transistor, the second transistor T2 is a driving transistor, and the third transistor T3 is a compensation transistor. A gate electrode of the first transistor T1 is coupled to a first scanning line Gn, a first electrode of the first transistor T1 is coupled to a data line Dn, a second electrode of the first transistor T1 is coupled to a gate electrode of the second transistor T2. The first transistor T1 is configured to receive a data signal transmitted by the data line Dn under control of the first scanning line Gn, and cause the gate electrode of the second transistor T2 to receive the data signal. The gate electrode of the second transistor T2 is coupled to the second electrode of the first transistor T1, a first electrode of the second transistor T2 is coupled to a first power supply voltage line VDD, and a second electrode of the second transistor T2 is coupled to a first electrode of OLED. The second transistor T2 is configured to generate corresponding current at the second electrode under the control of the data signal received by the gate electrode of the second transistor T2. A gate electrode of the third transistor T3 is coupled to the second scanning line Sn, a first electrode of the third transistor T3 is connected with the compensation line Se, and the second electrode of the third transistor T3 is coupled to the second electrode of the second transistor T2. the third transistor T3 is configured to extract a threshold voltage Vth and a migration rate of the second transistor T2 in response to a compensation timing so as to compensate a threshold voltage Vth. The first electrode of the OLED is coupled to the second electrode of the second transistor T2, and a second electrode of the OLED is coupled to the second power supply voltage line VSS. The OLED is configured to emit light with corresponding brightness in response to the current of the second electrode of the second transistor T2. A first electrode of the storage capacitor CST is coupled to the gate electrode of the second transistor T2, and a second electrode of the storage capacitor CST is coupled to the second electrode of the second transistor T2. The storage capacitor CST is configured to store the potential of the gate electrode of the second transistor T2.

The voltage of the first power supply voltage line VDD is greater than that of the second power supply voltage line VSS, the maximum voltage of the data signal of the data line Dn is less than that of the first scanning line Gn, and the maximum voltage of the data signal of the data line Dn is less than that of the first power supply voltage line VDD.

In a direction perpendicular to the substrate, a display substrate of the embodiment of the present disclosure includes a first metal layer, a first insulating layer, a metal oxide layer, a second insulating layer and a second metal layer which are stacked. The metal oxide layer includes a first pattern as an active layer of the first transistor, a second pattern as an active layer of the second transistor and a capacitor pattern as a first electrode of the storage capacitor. The first metal layer comprises a first electrode plate as a second electrode of the storage capacitor, wherein there is at least one first overlapping region between an orthographic projection of the first electrode plate on the substrate and an orthographic projection of the capacitor pattern on the substrate so as to form a first storage capacitor. The second metal layer includes a second electrode plate as another second electrode of the storage capacitor, wherein there is at least a second overlapping region between an orthographic projection of the second electrode plate on the substrate and the orthographic projection of the capacitor pattern on the substrate so as to form a second storage capacitor. The first electrode plate and the second electrode plate have the same potential to form a first storage capacitor and a second storage capacitor in parallel.

According to the display substrate provided by the embodiment of the present disclosure, the metal oxide layer forms a first storage capacitor with the first electrode plate of the first metal layer, the metal oxide layer forms a second storage capacitor with the second electrode plate of the second metal layer, and the first electrode plate and the second electrode plate have the same potential, thereby forming the first storage capacitor and the second storage capacitor in parallel, effectively increasing the capacity of the storage capacitor without affecting the display quality, and being beneficial to realizing high-resolution display.

The display substrate of the embodiment of the present disclosure may be realized in various ways, which are explained in detail by the embodiments below.

Figure 2A:
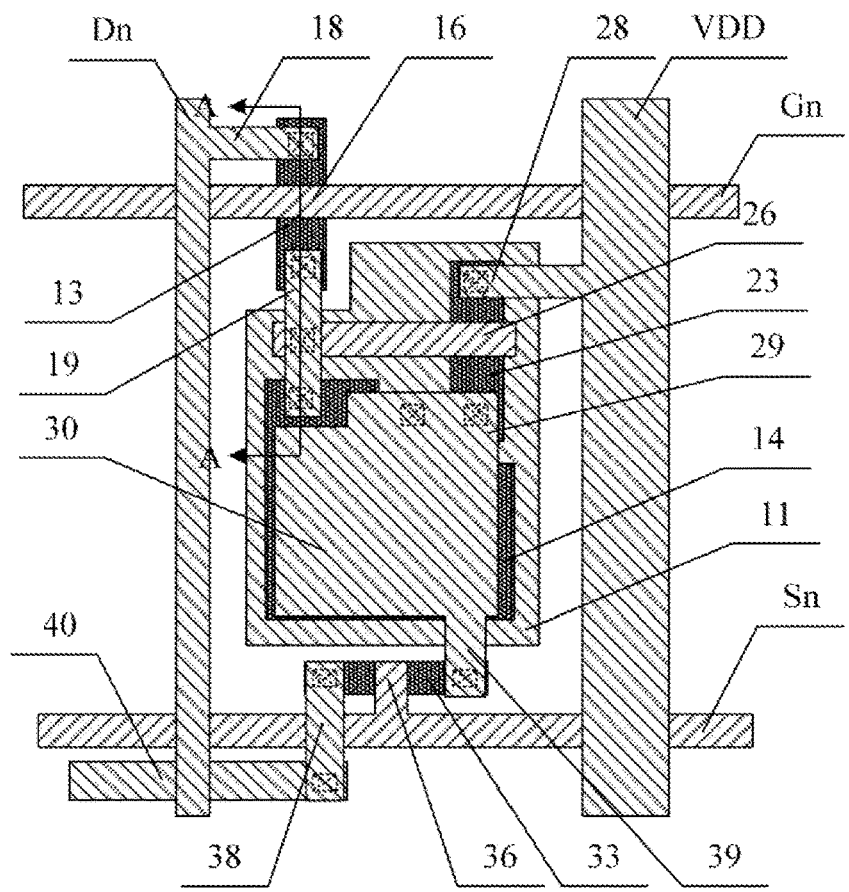
FIG. 2a is a schematic diagram of an exemplary local structure of a display substrate according to an embodiment of the present disclosure.
Figure 2B:
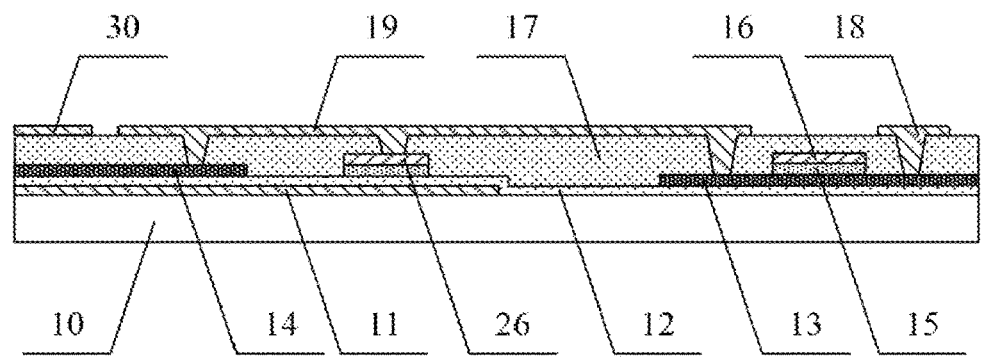

FIG. 2a is a schematic diagram of an exemplary local structure of a display substrate according to an embodiment of the present disclosure, and FIG. 2b is a sectional view taken along A-A in FIG. 2a. As shown in FIG. 2a and FIG. 2b, the display substrate provided in this embodiment includes: a substrate 10.

The display substrate further includes a first metal layer arranged on the substrate 10, the first metal layer includes a first electrode plate 11 and a connecting line 40, the first electrode plate 11 acts as a second electrode of a storage capacitor and is configured to form a first storage capacitor.

The display substrate further includes a first insulating layer 12 covering the first metal layer including the first electrode plate 11 and the connecting line 40.

The display substrate further includes a metal oxide layer arranged on the first insulating layer 12, the metal oxide layer includes a first pattern as a first active layer 13, a second pattern as a second active layer 23, a third pattern as a third active layer 33, and a capacitor pattern as a capacitor electrode plate 14, there is a first overlapping region between an orthographic projection of the capacitor electrode plate 14 on the substrate 10 and an orthographic projection of the first electrode plate 11 on the substrate 10, and the capacitor electrode plate 14 acts as a first electrode of the storage capacitor and is configured to form the first storage capacitor with the first electrode plate 11.

The display substrate further includes a gate insulating layer 15, as well as a first scanning line Gn, a second scanning line Sn, a first gate electrode 16, a second gate electrode 26 and a third gate electrode 36 which are arranged on the gate insulating layer 15, the gate insulating layer 15, the first scanning line Gn, the second scanning line Sn, the first gate electrode 16, the second gate electrode 26 and the third gate electrode 36 have a same pattern, the first gate electrode 16 and the first scanning line Gn are in an integrated structure, and the third gate electrode 36 and the second scanning line Sn are in an integrated structure.

The display substrate further includes a second insulating layer 17 covering the first scanning line Gn, the second scanning line Sn, the first gate electrode 16, the second gate electrode 26 and the third gate electrode 36, a plurality of via holes are arranged on the second insulating layer respectively, the plurality of via holes include a first via hole V1 and a second via hole V2 exposing both ends of the first active layer 13, a third via hole V3 exposing the second gate electrode 26, and a fourth via hole V4 exposing the capacitor electrode plate 14, a fifth via hole V5 and a sixth via hole V6 exposing both ends of the second active layer 23, a seventh via hole V7 exposing the first electrode plate 11, an eighth via hole V8 and a ninth via hole V9 exposing both ends of the third active layer 33, and a tenth via hole V10 exposing the connecting line 40, wherein in an exemplary implementation, the first active layer may be an active layer of the first transistor T1, the second active layer may be an active layer of the second transistor T2, and the third active layer may be an active layer of the third transistor T3.

The display substrate further includes a second metal layer arranged on the second insulating layer 17, the second metal layer includes a data line Dn, a first power supply voltage line VDD, a first source electrode 18, a first drain electrode 19, a second source electrode 28, a second drain electrode 29, a third source electrode 38, a third drain electrode 39 and a second electrode plate 30, there is a second overlapping region between the orthographic projection of the second electrode plate 30 on the substrate 10 and an orthographic projection of the capacitor electrode plate 14 on the substrate 10, the second electrode plate 30 acts as another second electrode of the storage capacitor and is configured to form a second storage capacitor with the capacitor electrode plate 14. The first source electrode 18 and the data line Dn are in an integrated structure, the second source electrode 28 and the first power supply voltage line VDD are in an integrated structure, and the second drain electrode 29, the third drain electrode 39 and the second electrode plate 30 are in an integrated structure. The first source electrode 18 is connected with one end of the first active layer 13 through the first via hole V1, and the first drain electrode 19 is connected with the other end of the first active layer 13 through the second via hole V2. At the same time, the first drain electrode 19 is connected with the second gate electrode 26 through the third via hole V3, and the first drain electrode 19 is also connected with the capacitor electrode plate 14 through the fourth via hole V4. The second source electrode 28 is connected with one end of the second active layer 23 through the fifth via hole V5, and the second drain electrode 29 is connected with the other end of the second active layer 23 through the sixth via hole V6. The third source electrode 38 is connected with one end of the third active layer 33 through the eighth via hole V8 and is connected with the connecting line 40 through the tenth via hole V10 at the same time, and the third drain electrode 39 is connected with the other end of the third active layer 33 through the ninth via hole V9. The second electrode plate 30 is connected with the first electrode plate 11 through the seventh via hole V7, causing the first electrode plate 11 and the second electrode plate 30 to have the same potential.

In an exemplary implementation, the first source electrode 18 may be a source electrode of the first transistor T1, the first drain electrode 19 may be a drain electrode of the first transistor T1, the second source electrode 28 may be a source electrode of the second transistor T2, the second drain electrode 29 may be a drain electrode of the second transistor T2, the third source electrode 38 may be a source electrode of the third transistor T3, and the third drain electrode 39 may be a drain electrode of the third transistor T3.

In an exemplary implementation, the source electrode of the first transistor T1 may be the first electrode or the second electrode of the first transistor T1, and the drain electrode of the first transistor T1 may be the second electrode or the first electrode of the first transistor T1. The source electrode of the second transistor T2 may be the first electrode or second electrode of the second transistor T2, and the drain electrode of the second transistor T2 may be the second electrode or the first electrode of the second transistor T2. The source electrode of the third transistor T3 may be the first electrode or second electrode of the third transistor T3, and the drain electrode of the third transistor T3 may be the second electrode or the first electrode of the third transistor T3.

The capacitor electrode plate 14, the first active layer 13, the second active layer 23 and the third active layer 33 are arranged on the same layer, made of the same material and formed by the same patterning process. The second electrode plate 30, the data line Dn, the first power supply voltage line VDD, the first source electrode 18, the first drain electrode 19, the second source electrode 28, the second drain electrode 29, the third source electrode 38 and the third drain electrode 39 are arranged on the same layer, made of the same material and formed by a same patterning process.

In this embodiment, the capacitor electrode plate 14 acts as the first electrode of the storage capacitor, the first electrode plate 11 acts as the second electrode of the storage capacitor and at the same time acts as a shielding layer, and the second electrode plate 30 acts as another second electrode of the storage capacitor, forming two parallel storage capacitors. The two parallel storage capacitors are a first storage capacitor between the first electrode plate 11 and the capacitor electrode plate 14, and a second storage capacitor between the second electrode plate 30 and the capacitor electrode plate 14.

The technical solutions of this embodiment are described below in detail through the preparation process of the display substrate in this embodiment. A "patterning process" mentioned in the embodiment includes deposition of a film layer, coating of photoresist, mask exposure, development, etching, stripping of photoresist, etc., and is a known mature preparation process. Deposition may be performed by using a known process such as sputtering, evaporation, chemical vapor deposition, or the like, coating may be performed by using a known coating process, and etching may be performed by using a known method, which is not limited here. In the description of the embodiment, it should be understood that "thin film" refers to a layer of thin film made of a certain material by deposition or other processes on the substrate. If the "film" does not need a patterning process during the whole preparing process, the "film" can also be called a "layer". If the "thin film" needs a patterning process during the whole manufacturing process, it is called "thin film" before the patterning process and "layer" after the patterning process. The "layer" after the patterning process contains at least one "pattern".

(1) Forming a Pattern of a First Metal Layer

Figure 3A:
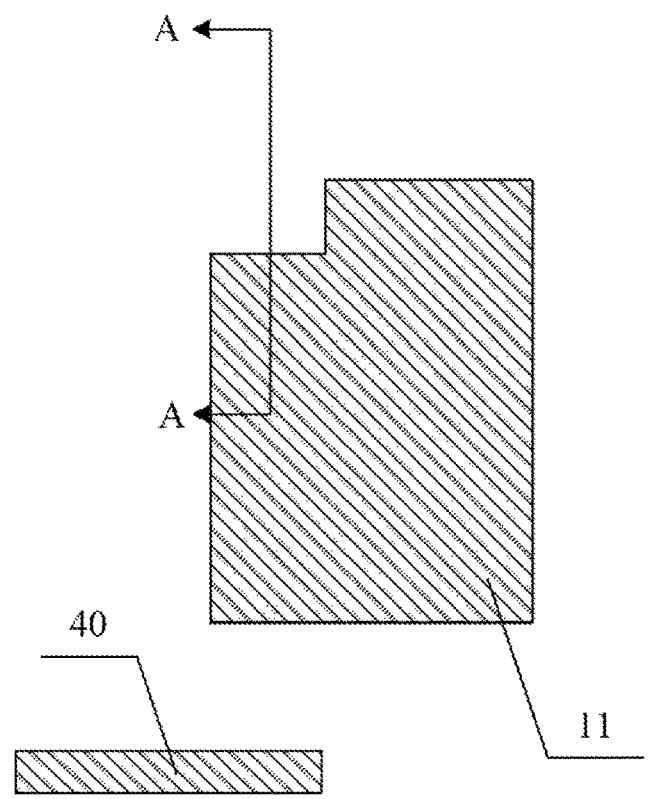
FIG. 3a is a schematic diagram after forming a first metal layer pattern of the present disclosure.
Figure 3B:
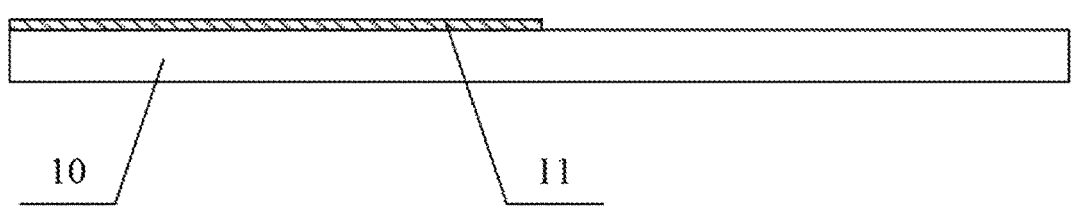

Forming the pattern of the first metal layer includes: depositing a first metal film on the substrate, patterning the first metal film by a patterning process, and forming a first metal layer including patterns of the first electrode plate 11 and the connecting line 40 on the substrate 10, as shown in FIG. 3a and FIG. 3b. FIG. 3b is a sectional view taken along A-A in FIG. 3a. In this embodiment, the first electrode plate 11 acts as both a shielding layer and a second electrode of the storage capacitor, and is configured to form the first storage capacitor.

(2) Forming a Pattern of a Metal Oxide Layer

Figure 4A:
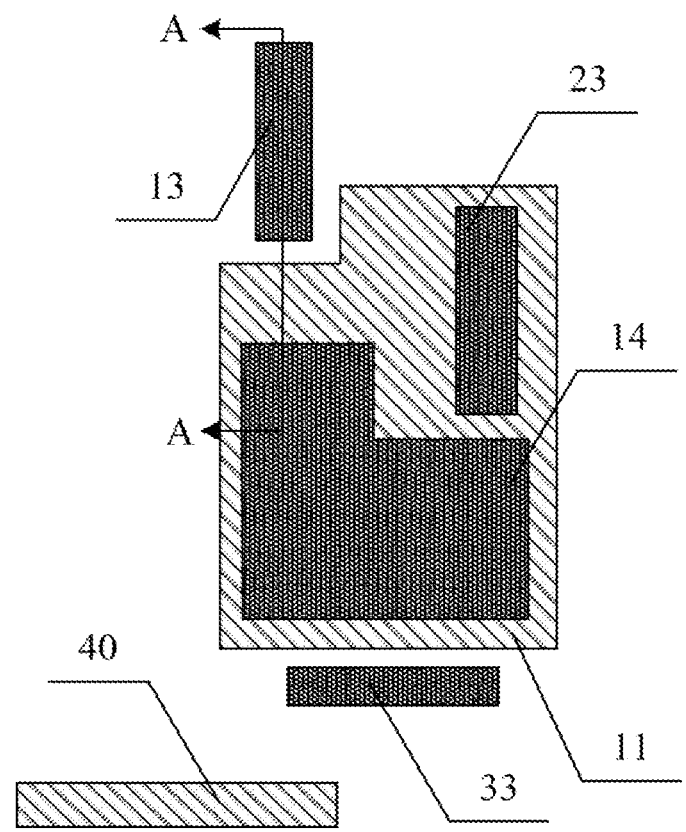
FIG. 4a is a schematic diagram after forming an active layer and a pattern of capacitor electrode plate of the present disclosure.
Figure 4B:
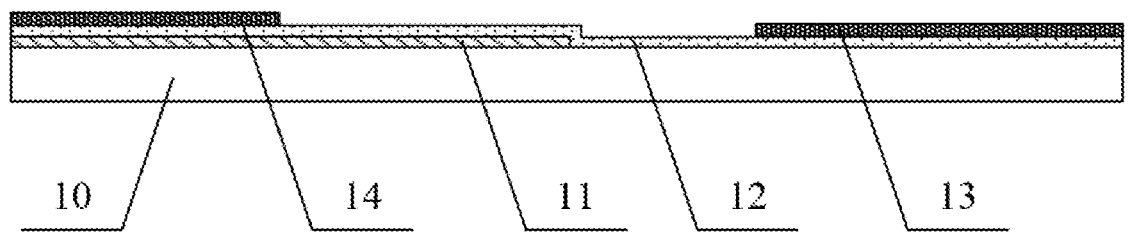

Forming the pattern of the metal oxide layer includes: depositing the first insulating film and the metal oxide film in sequence on the substrate with the above pattern, patterning the metal oxide film by a patterning process, forming a first insulating layer 12 covering the first electrode plate 11 and the connecting line 40, and forming the pattern of the metal oxide layer on the first insulating layer 12. The metal oxide layer includes the second active layer 23, the first active layer 13, the third active layer 33 and the capacitor electrode plate 14 pattern, as shown in FIG. 4a and FIG. 4b, and FIG. 4b is a sectional view taken along A-A in FIG. 4a. As the active layer of the first transistor, the first active layer 13 corresponds to the first pattern. As the active layer of the second transistor, the second active layer 23 corresponds to the second pattern. As the active layer of the third transistor, the third active layer 33 corresponds to the third pattern. As the first electrode of the storage capacitor, the capacitor electrode plate 14 corresponds to the capacitor pattern and performs a conductive processing to the capacitor pattern. There is a first overlapping region between the orthographic projection of the capacitor electrode plate 14 (capacitor pattern) on the substrate 10 and the orthographic projection of the first electrode plate 11 on the substrate 10, wherein as the second electrode of the storage capacitor, the first electrode plate 11 forms the first storage capacitor with the capacitor electrode plate 14. The orthographic projection of the second active layer 23 (second pattern) as the active layer of the second transistor on the substrate 10 overlaps with the orthographic projection of the first electrode plate 11 on the substrate 10, so that the first electrode plate 11 as the shielding layer can shield a channel region of the second transistor, thus avoiding the influence of light on the channel and preventing the display effect from being affected by the light-induced leakage generated at the channel. In this embodiment, the orthographic projection of the first active layer 13 (first pattern) as the active layer of the first transistor on the substrate 10 and the orthographic projection of the capacitor electrode plate 14 (capacitor pattern) on the substrate 10 are arranged apart, that is, there is no overlapping region between them. The orthographic projection of the first active layer 13 (first pattern) on the substrate 10 and the orthographic projection of the first electrode plate 11 on the substrate 10 are arranged apart, that is, there is no overlapping region between them. In this embodiment, by designing the widths of the first active layer 13 and the second active layer 23, the channel aspect ratio of the first transistor is less than that of the second transistor.

(3) Forming a Pattern of a Gate Electrode

Figure 5A:
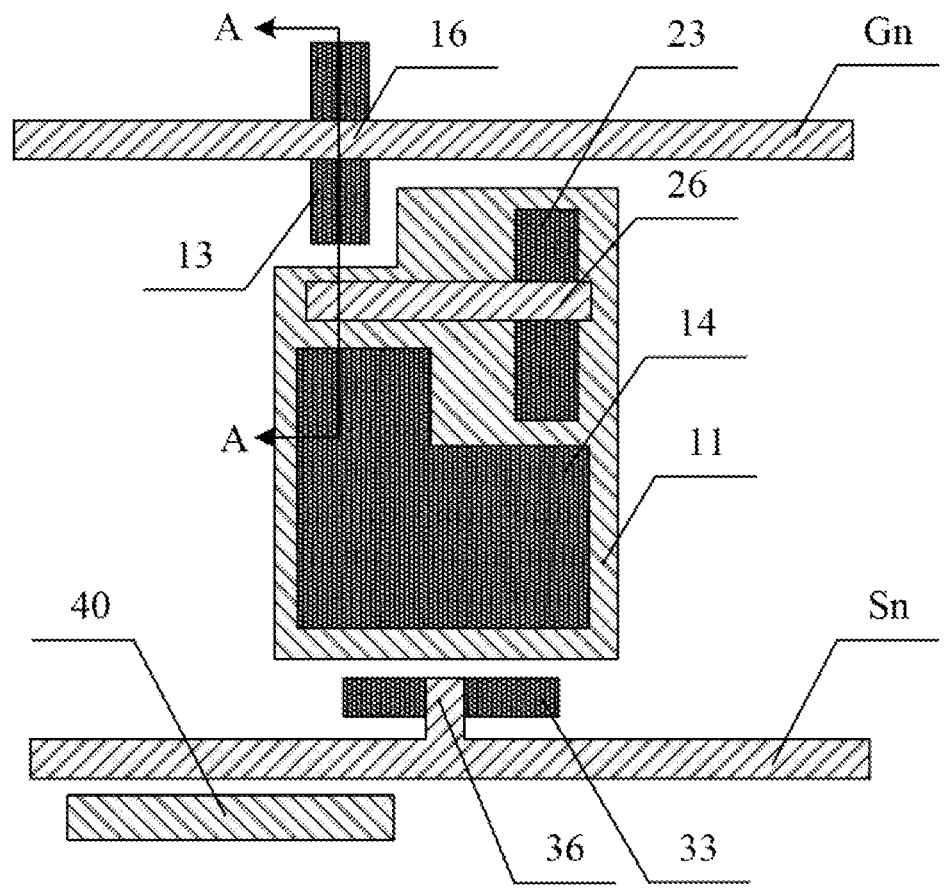
FIG. 5a is a schematic diagram after forming a pattern of a gate electrode of the present disclosure.
Figure 5B:
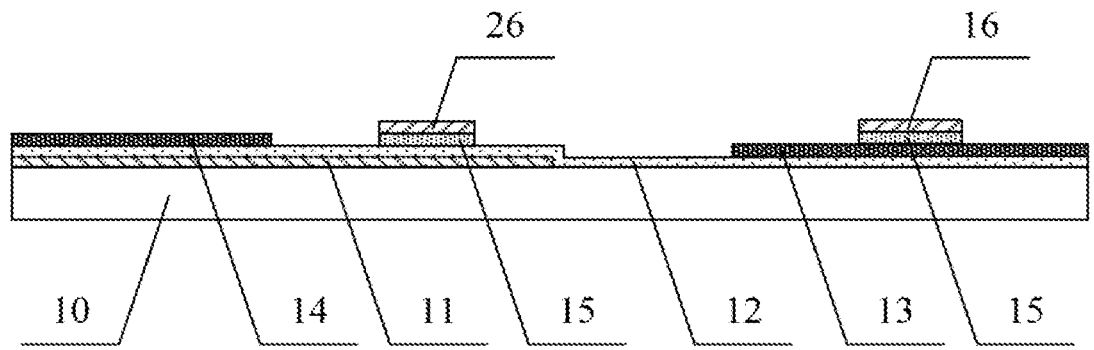

Forming the pattern of the gate electrode includes: depositing a gate insulating film and a gate metal film in sequence on the substrate formed with the above pattern, patterning the gate insulating film and the gate metal film by a patterning process, and forming a pattern of the gate insulating layer 15 and patterns of the first scanning line Gn, the second scanning line Sn, the first gate electrode 16, the second gate electrode 26 and the third gate electrode 36 arranged on the gate insulating layer 15. The gate insulating layer 15, the first scanning line Gn, the second scanning line Sn, the first gate electrode 16, the second gate electrode 26 and the third gate electrode 36 have the same pattern, the second gate electrode 26 is located at a corresponding position of the first electrode plate 11, the first gate electrode 16 is in an integrated structure connected with the first scanning line Gn, and the third gate electrode 36 is in an integrated structure connected with the second scanning line Sn, as shown in FIG. 5a and FIG. 5b. FIG. 5b is a sectional view taken along A-A in FIG. 5a.

(4) Forming a Pattern of a Second Insulating Layer

Figure 6A:
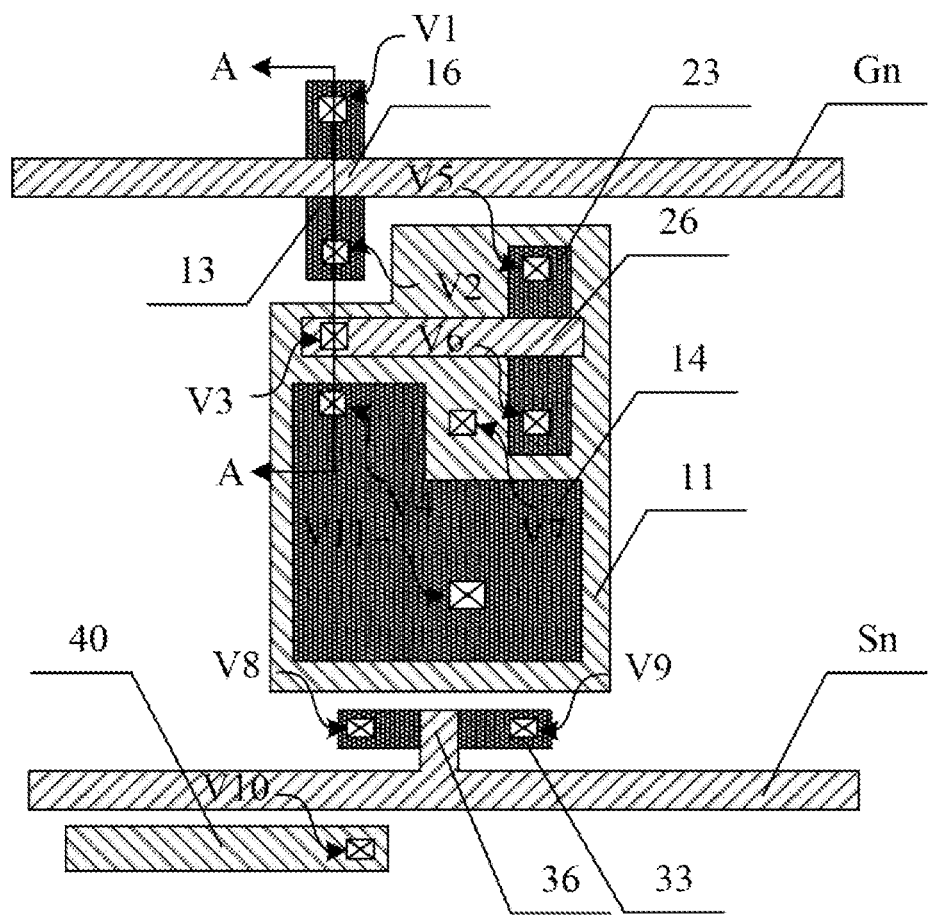
FIG. 6a is a schematic diagram after forming a pattern of a second insulating layer of the present disclosure.
Figure 6B:
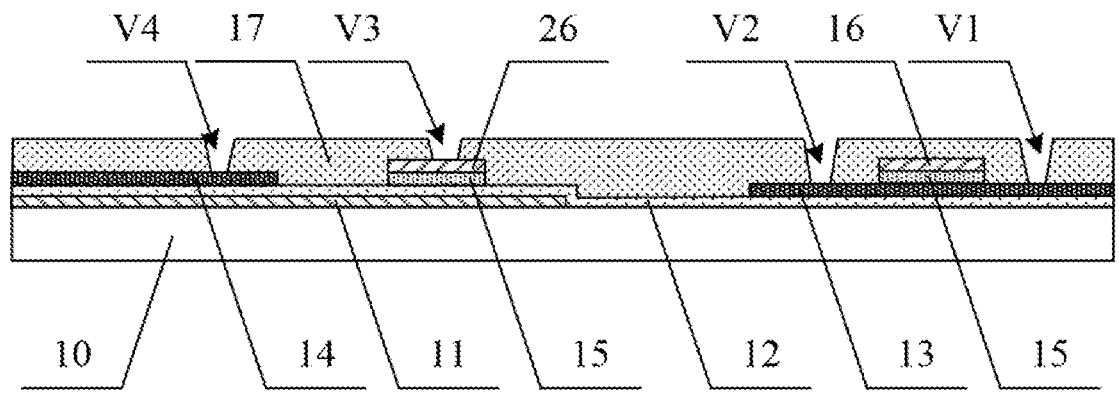

Forming the pattern of the second insulating layer includes: depositing a second insulating film on the substrate with the above pattern, patterning the second insulating film by a patterning process, and forming a pattern of the second insulating layer 17 covering the above structure. A plurality of via holes are arranged on the second insulating layer 17, the plurality of via holes are a first via hole V1 and a second via hole V2 exposing both ends of the first active layer 13, a third via hole V3 exposing the second gate electrode 26, a fourth via hole V4 exposing the capacitor electrode plate 14, a fifth via hole V5 and a sixth via hole V6 exposing both ends of the second active layer 23, a seventh via hole V7 exposing the first electrode plate 11, an eighth via hole V8 and a ninth via hole V9 exposing both ends of the third active layer 33, and a tenth via hole V10 exposing the connecting line 40 respectively, as shown in FIG. 6a and FIG. 6b, and FIG. 6b is a cross-sectional view taken along A-A in FIG. 6a. In this embodiment, the thickness of the gate insulating layer 15 is less than that of the second insulating layer 17, and the thickness of the first insulating layer 12 is less than A sum of the thicknesses of the gate insulating layer 15 and the second insulating layer 17. So the capacity of the storage capacitor is increased on the premise of ensuring the insulating effect.

(5) Forming a Pattern of a Second Metal Layer

Forming the pattern of the second metal layer includes: depositing a second metal thin film on the substrate with the above pattern, patterning the second metal thin film by a patterning process, and forming the pattern of the second metal layer on the second insulating layer 17. The second metal layer includes patterns of a data line Dn, a first power supply voltage line VDD, a first source electrode 18, a first drain electrode 19, a second source electrode 28, a second drain electrode 29, a third source electrode 38, a third drain electrode 39 and a second electrode plate 30. The first source electrode 18 is in an integrated structure connected with the data line Dn, the second source electrode 28 is in an integrated structure connected with the first power supply voltage line VDD, and the second drain electrode 29 and the third drain electrode 39 are in an integrated structure connected with the second electrode plate 30. The first source electrode 18 is connected with one end of the first active layer 13 through the first via hole V1, and the first drain electrode 19 is connected with the other end of the first active layer 13 through the second via hole V2. At the same time, the first drain electrode 19 is connected with the second gate electrode 26 through the third via hole V3, and the first drain electrode 19 is also connected with the capacitor electrode plate 14 through the fourth via hole V4. The second source electrode 28 is connected with one end of the second active layer 23 through the fifth via hole V5, and the second drain electrode 29 is connected with the other end of the second active layer 23 through the sixth via hole V6. The third source electrode 38 is connected with one end of the third active layer 33 through the eighth via hole V8 and is connected with the connecting line 40 through the tenth via hole V10 at the same time, and the third drain electrode 39 is connected with the other end of the third active layer 33 through the ninth via hole V9. The second electrode plate 30 is connected with the first electrode plate 11 through the seventh via hole V7. There is a second overlapping region between the orthographic projection of the second electrode plate 30 on the substrate 10 and the orthographic projection of the capacitor electrode plate 14 on the substrate 10. The second electrode plate 30 acts as another second electrode of the storage capacitor and is configured to form a second storage capacitor with the capacitor electrode plate 14, as shown in FIG. 2a and FIG. 2b. In this embodiment, the thickness of the second metal layer is greater than that of the gate metal layer.

In this embodiment, the first metal layer, the gate metal layer and the second metal layer may adopt metal materials such as any one of chromium (Cr), gold (Au), zinc (Zn), silver (Ag), copper (Cu), aluminum (Al), molybdenum (Mo), tantalum (Ta), titanium (Ti), tungsten (W), manganese (Mn), nickel (Ni), iron (Fe), cobalt (Co), etc., or alloys containing above metal element as ingredient or alloys containing a combination of above metal elements, such as an alloy of aluminum and neodymium (AlNd) or an alloy of molybdenum and niobium (MoNb), etc., or multilayer metal, such as Mo/Cu/Mo, etc. In an exemplary implementation, a Cu—X alloy film (where x is Mn, Ni, Cr, Fe, Co, Mo, Ta or Ti) may be used. By using the Cu—X alloy film, the film can be processed by a wet etching process, and the manufacturing cost can be reduced. In an exemplary implementation, a Cu—Mn alloy film is used. The first metal layer has a thickness of 800-1200 Angstroms, the gate metal layer has a thickness of 3000-5000 Angstroms, and the second metal layer has a thickness of 3000-9000 Angstroms.

The first insulating layer, the gate insulating layer and the second insulating layer may adopt silicon oxide (SiOx), silicon nitride (SiNx) or silicon oxynitride (SiON), etc., or aluminum oxide (AlOx), hafnium oxide (HfOx), tantalum oxide (TaOx), yttrium oxide, zirconium oxide, gallium oxide, magnesium oxide, lanthanum oxide, cerium oxide or neodymium oxide, etc. The first insulating layer has a thickness of 3000 to 5000 angstroms, the gate insulating layer has a thickness of 1000 to 2000 angstroms, and the second insulating layer has a thickness of 4500 to 7000 angstroms.

In this embodiment, the metal oxide layer may adopt oxides containing indium and tin, oxides containing tungsten and indium, oxides containing tungsten and indium and zinc, oxides containing titanium and indium, oxides containing titanium and indium and tin, oxides containing indium and zinc, oxides containing silicon and indium and tin, or oxides containing indium and gallium and zinc, etc.

The metal oxide layer may be an oxide semiconductor containing indium (In), which can improve carrier migration rate (electron migration rate). In addition, the oxide semiconductor may contain an element M. The element M may be aluminum, gallium, yttrium, tin, etc. Other elements that can be used as the element M include boron, silicon, titanium, iron, nickel, germanium, yttrium, zirconium, molybdenum, lanthanum, cerium, neodymium, hafnium, tantalum or tungsten, etc. Note that, as the element M, a plurality of the above elements may sometimes be combined. The element M is, for example, an element with high bond energy with oxygen. The element M is an element with higher bond energy with oxygen than indium. Optionally, the element M is, for example, an element having a function of increasing an energy gap of an oxide semiconductor. In addition, the metal oxide layer may contain zinc (Zn). When the oxide semiconductor contains zinc, the oxide semiconductor is easy to crystallize. In an exemplary implementation, the oxide semiconductor is not limited to an oxide semiconductor containing indium, but may be an oxide semiconductor containing zinc, gallium or tin without indium, such as zinc tin oxide or gallium tin oxide, etc.

In case that the metal oxide layer is an In-M-Zn oxide, when a sum of In and M is 100 atomic %, it may be that In is lower than 50 atomic % and M is higher than 50 atomic %. The metal oxide layer uses an oxide with a large energy gap, for example, more than 2 0.5 eV and less than 4 0.2 eV, or more than 2 0.8c V and less than 3 0.8 eV, or more than 3 eV and less than 3 0.5 eV. In an exemplary implementation, the metal oxide layer is an oxide containing indium (In), M and zinc (Zn), wherein M is aluminum (Al), gallium (Ga) or tin (Sn).

In this embodiment, the compositions of the active layers of the first, second and third transistors may be the same or substantially the same to reduce the manufacturing cost. This embodiment is not limited to this, and the compositions of the active layers of the three transistors may be different from each other. The field effect migration rate of the first transistor and the second transistor may be improved when the active layers of the three transistors all have regions where the atomic percentage of In is greater than the atomic percentage of M. For example, one or both of the field effect migration rate of the first transistor and the second transistor may exceed 10 cm2/Vs, for example, it may exceed 30 cm2/vs. For example, when the above transistor with a high field effect migration rate is used for a gate electrode driver generating a gate signal of a display device, the display device may have a frame with a narrow width. When the above transistor with a high field effect migration rate is used for a source driver providing a signal from a signal line included in a display device, the number of wirings connected with the display device may be reduced. When the transistor with a high field effect migration rate is used for the transistor of the pixel circuit included in the display device, the display quality of the display device may be improved.

In an exemplary implementation, the metal oxide layer of this embodiment may be a single layer, double layers or a plurality of layers. When the metal oxide layer is double layers, it includes a first oxide layer and a second oxide layer stacked. The conductivity of the second oxide layer may be lower than that of the first oxide layer and the band gap width of the second oxide layer may be greater than that of the first oxide layer. The first oxide layer may be a main channel layer for electron movement, and thus may be configured to be close to the first, second and third gate electrodes. When the metal oxide layer is a single layer, an indium gallium zinc oxide (IGZO) material may be used.

In this embodiment, because one part of the metal oxide layer acts as the active layer of the transistor and the other part acts as the first electrode of the storage capacitor, when making a conducting processing, on one hand, different channel directions and shapes of different sub-pixels may be realized to adapt to different aspect ratio designs. For example, by designing the widths of the first active layer and the second active layer, the channel aspect ratio of the first transistor is less than that of the second transistor. On the other hand, the metal oxide layer may have different composition contents in different areas within a sub-pixel to meet different electrical characteristic requirements.

The aforementioned conductive processing means performing a plasma processing using the first gate electrode, the second gate electrode and the third gate electrode as masks, and processing a metal oxide layer in the corresponding region into a conductive layer, after forming the patterns of the first gate electrode, the second gate electrode and the third gate electrode. As shown in FIG. 4a and FIG. 5a, the metal oxide layer may be divided into three regions. A first region includes a region overlapping with the first gate electrode, the second gate electrode and the third gate electrode, and acts as a channel region of the transistor. A second region includes a region adjacent to the first gate electrode, the second gate electrode and the third gate electrode but not covered by the first gate electrode, the second gate electrode and the third gate electrode, and acts as a source and drain region of the transistor. A third region includes a region overlapping with the first electrode plate and the second electrode plate, and acts as a electrode plate region of the storage capacitor. In this embodiment, the compositions of indium gallium zinc oxide (IGZO) in the three regions are different.

In this embodiment, the oxygen content of the first region ranges from 30 to 50 atomaic %, the oxygen content of the second region ranges from 50 to 60 atomaic %, and the oxygen content of the third region ranges from 60 to 70 atomaic %. In an exemplary implementation, the oxygen content of IGZO in the first region is less than that in the second region, and the oxygen content of IGZO in the second region is less than that in the third region. The zinc content of IGZO in the first region is greater than that in the second region, and the zinc content of IGZO in the second region is greater than that in the third region. In an exemplary implementation, the atomic ratio (O/Zn) of oxygen and zinc in the first region is less than that in the third region, and the atomic ratio (O/Zn) of oxygen and zinc in the second region is less than that in the third region. In addition, the oxide in the first region is mainly of semiconductor character. Increasing the In element content can significantly increase the carrier concentration. In order to increase the carrier concentration in the first region so as to improve the driving ability of the transistor, the In atom content in the first region is greater than that in the second region, and then the In atom content in the second region is greater than that in the third region.

Following table gives an example of the composition of indium gallium zinc oxide (IGZO) in three regions. Weight % represents the proportion of the element in the oxide, and Atomic % represents the atomic percentage of the element in the oxide.

|  | First region | | Second region | | Third region | |
| --- | --- | --- | --- | --- | --- | --- |
| Element | Weight(%) | Atomic(%) | Weight(%) | Atomic(%) | Weight(%) | Atomic(%) |
| Oxygen O | 11.82. | 40.24. | 19.47. | 55.39. | 23.35. | 60.94. |
| Zinc Zn | 25.68. | 21.40. | 19.61. | 13.65. | 18.72. | 11.95. |
| Gallium Ga | 28.38. | 22.18. | 26.51. | 17.31. | 25.66. | 15.37. |
| Indium In | 34.12. | 16.18. | 34.4. | 13.63. | 32.24. | 11.72. |

The first region is a channel region of at least one of the three transistors, the second region is a source-drain region of at least one of the three transistors, and the third region is an electrode plate region of the storage capacitor. As shown in the above table, IGZO includes elements such as oxygen (O), zinc (Zn), gallium (Ga) and indium (In), etc. The first region is not performed a plasma processing due to the shielding of the gate electrode. The weight relative content of a plurality of elements O:Zn:Ga:In is 11.82:25.68:28.38:34.12, and the atomic relative content is 40.24:21.40:22.18:16.18. Because the third region is not shielded, the third region is performed the plasma processing. The weight relative content of a plurality of elements O:Zn:Ga:In is 23.35:18.72:25.66:32.24, and the atomic relative content is 60.94:11.95:15.37:11.72. After the plasma processing, the weight and atomic content of oxygen in IGZO in the third region increase greatly, and the weight and atomic content of zinc (Zn) decrease, thus improving the conductivity of IGZO. Although the second region is not shielded by the gate electrode, because this region is adjacent to the gate electrode and influenced by the gate electrode, the weight and atomic content of oxygen in the second region is lower than that in the third region, and the weight and atomic content of zinc (Zn) is higher than that in the third region. So the conductivity of IGZO in the second region is lower than that in the third region.

As the metal oxide layer in the third region acts as the first electrode of the storage capacitor, it needs good conductivity, that is, it needs a better degree of conductivity. When adopting the gate electrode as a mask to perform the plasma processing, theoretically, the farther a region is away from the gate electrode, the better the conductivity of the region is, and the better the conductivity of the region is. Therefore, in this embodiment, it may be arranged that a minimum distance between the metal oxide layer (capacitor electrode plate 14) and the first gate electrode 16 in the third region is greater than L1, a minimum distance between the capacitor electrode plate 14 and the second gate electrode 26 is greater than L2, and a minimum distance between the capacitor electrode plate 14 and the third gate electrode 36 is greater than L3, wherein L1 is the width of the first gate electrode 16, L2 is the width of the second gate electrode 26, L3 is the width of the third gate electrode 36. In this way, the plasma processing of the metal oxide layer in the third region is not affected by the first gate electrode 16, the second gate electrode 26 and the third gate electrode 36, improving the conductivity of the metal oxide layer in the third region to the maximum. It should be noted that the above distance is a distance between them in a direction perpendicular to the substrate. In addition, as a modified embodiment, due to the requirement of a high-resolution backplane design, the minimum distance between the metal oxide layer (capacitor electrode plate 14) and the first gate electrode 16 in the third region is greater than L1, the minimum distance between the capacitor electrode plate 14 and the second gate electrode 26 is greater than L2, and the minimum distance between the capacitor electrode plate 14 and the third gate electrode 36 is greater than L3. These three designs can meet any two or one circumstance thereof. In another exemplary implementation, it may be designed to consider that an overlapping pattern of the capacitor electrode plate 14 with the first electrode and the second electrode satisfies the above relationship. L1 is the width of the first gate electrode 16, L2 is the width of the second gate electrode 26, and L3 is the width of the third gate electrode 36. In this way, the plasma processing of the metal oxide layer in the third region is less affected by the first gate electrode 16, the second gate electrode 26, and the third gate electrode 36, thus improving the conductivity of the metal oxide layer in the third region to the maximum.

It can be seen from the structure and preparation process of the display substrate in this embodiment that the capacitor electrode plate 14 made of metal oxide material is adopted as the first electrode of the storage capacitor, the first electrode plate 11 in the first metal layer is adopted as the second electrode of the storage capacitor, and the second electrode plate 30 in the second metal layer is adopted as the other second electrode of the storage capacitor. Since the second electrode plate 30 is connected with the first electrode plate 11 through the eleventh via hole V7, the first electrode plate 11 and the second electrode plate 30 have the same potential. While the capacitor electrode plate 14, which is the first electrode of the storage capacitor, is connected with the second gate electrode 26 through the third via hole V3, the first drain electrode 19 and the fourth via hole V4, and has a voltage different from that of the first electrode plate 11 and the second electrode plate 30. Therefore, two parallel storage capacitors are formed between the first electrode plate 11, the capacitor electrode plate 14 and the second electrode plate 30. The two parallel storage capacitors are a first storage capacitor between the first electrode plate 11 and the capacitor electrode plate 14, and a second storage capacitor between the second electrode plate 30 and the capacitor electrode plate 14 respectively. Since a transparent electrode layer (not shown) is formed on the second electrode plate 30, and a third capacitor is formed between the transparent electrode layer and the capacitor electrode plate 14, this embodiment actually forms three parallel storage capacitors. Therefore, compared with the original structure, the storage capacitor of the embodiment of the present disclosure is formed by three parallel capacitors, increasing the capacity of the storage capacitor to the maximum. In this embodiment, the capacitor electrode plate 14, which is the first electrode of the storage capacitor, is located on the same layer as the active layer and between the first metal layer and the second metal layer, so the distance between the capacitor electrode plate 14 and the first electrode plate 11 is short, only the first insulating layer 12 is between the capacitor electrode plate 14 and the first electrode plate 11, and the distance between the capacitor electrode plate 14 and the second electrode plate 30 is also short, only the second insulating layer 17 is between the capacitor electrode plate 14 and the second electrode plate 30. Since the thickness of the insulating layer in between is thin and the area of the first electrode plate 11 as the shielding layer is large, the capacity of each storage capacitor in the present disclosure is greater than that of the storage capacitor of the original structure. Even when applied to a smaller pixel size, the required storage capacitor capacity can be ensured, which is beneficial to the realization of high-resolution display. Since the first insulating layer 12 and the second insulating layer 17 do not need to use high dielectric constant materials or reduce the thickness, the structural design of the embodiment of the present disclosure does not increase the process flow, can be compatible with the self-aligned doping process, does not affect the performance of the thin film transistor, and ensures the display quality.

In an exemplary implementation, the composition times of the display substrate prepared in this embodiment are the same as those of the original preparation method. The implementation of this embodiment may utilize the existing process equipment, and has good process compatibility, strong practicability and good application prospect.

In summary, this embodiment effectively increases the storage capacitance on the premise of ensuring the display quality, and is beneficial to realize high-resolution display.

Figure 7A:
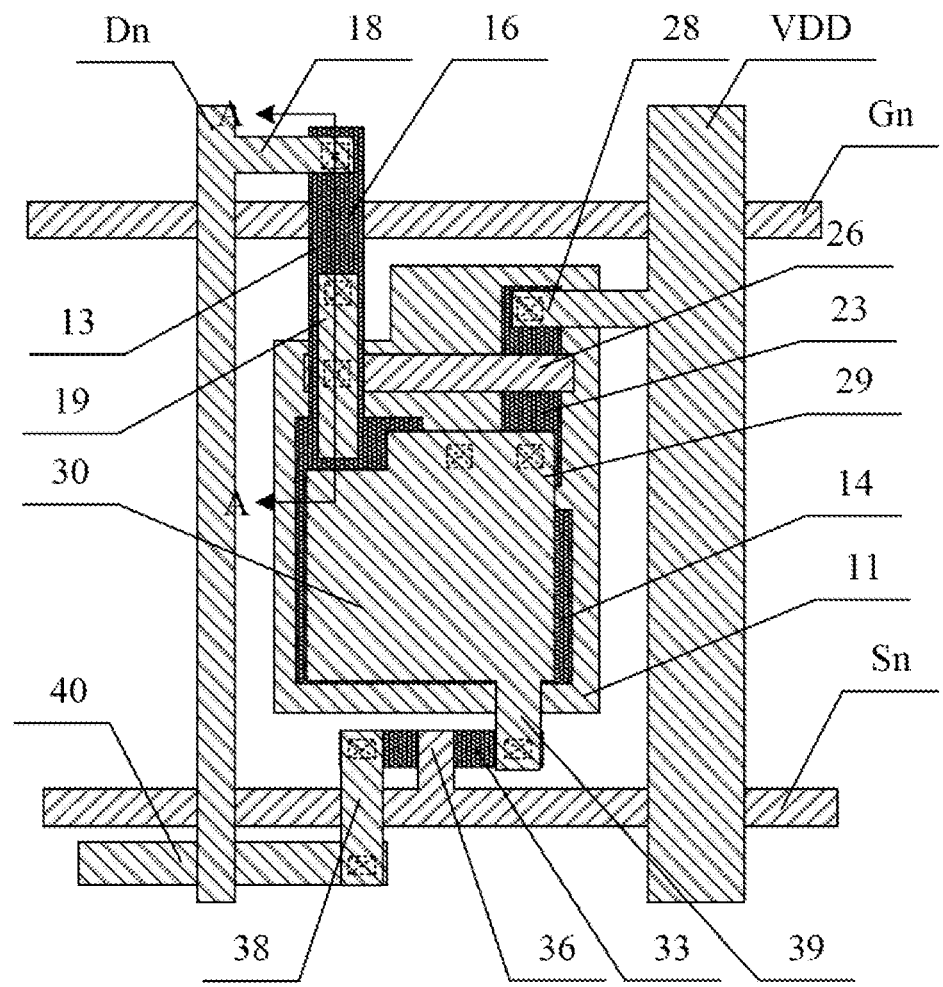
FIG. 7a is a schematic diagram of another exemplary local structure of a display substrate according to an embodiment of the present disclosure.
Figure 7B:
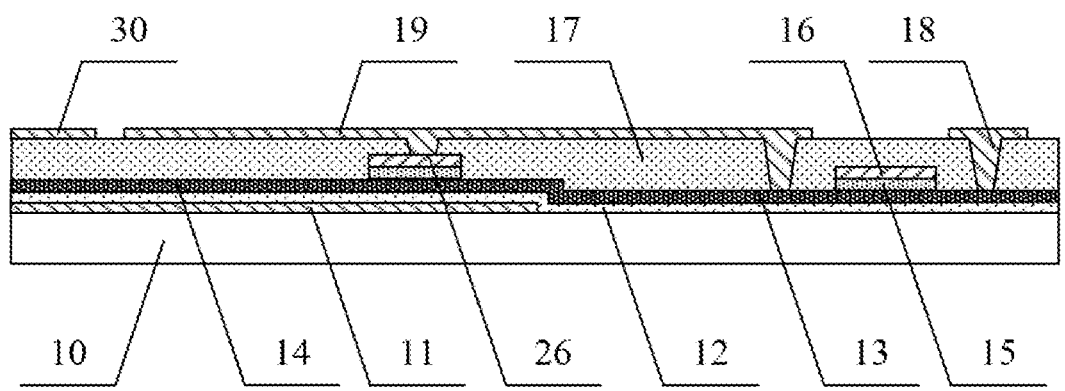

FIG. 7a is a schematic diagram of another exemplary local structure of a display substrate according to an embodiment of the present disclosure, and FIG. 7b is a sectional view taken along A-A in FIG. 7a. This embodiment includes a capacitor electrode plate as the first electrode of storage capacitor, a first electrode plate as a shielding layer and a second electrode of storage capacitor, and a second electrode plate as another second electrode of storage capacitor. A first storage capacitor is formed between the first electrode plate and the capacitor electrode plate. A second storage capacitor is formed between the second electrode plate and the capacitor electrode plate. The first storage capacitor and the second storage capacitor are connected in parallel to form the storage capacitor. As shown in FIG. 7a and FIG. 7b, in this embodiment, the capacitor electrode plate 14 and the first active layer 13 (the first pattern) may be in an integrated structure, that is, the capacitor electrode plate 14 and the first active layer 13 are formed of continuous metal oxide, and a fourth via hole is eliminated. For example, the display substrate of this embodiment includes: a substrate 10, a first electrode plate 11, a connecting wire 40 and a first insulating layer 12, the structure of which may be seen description in the previous embodiments.

The display substrate further includes a metal oxide layer arranged on the first insulating layer 12. The metal oxide layer includes a first active layer 13, a second active layer 23, a third active layer 33 and a capacitor electrode plate 14, the first active layer 13 and the capacitor electrode plate 14 are in an integrated structure, there is a first overlapping region between an orthographic projection of the capacitor electrode plate 14 on the substrate 10 and an orthographic projection of the first electrode plate 11 on the substrate 10, and the capacitor electrode plate 14 acts as the first electrode of the storage capacitor to form a first storage capacitor with the first electrode plate 11.

The display substrate further includes a gate insulating layer 15, and a first scanning line Gn, a second scanning line Sn, a first gate electrode 16, a second gate electrode 26 and a third gate electrode 36 arranged on the gate insulating layer 15, the structure of which may be seen description in the above embodiments.

The display substrate further includes a second insulating layer 17 covering the first scanning line Gn, the second scanning line Sn, the first gate electrode 16, the second gate electrode 26 and the third gate electrode 36. A plurality of via holes are respectively arranged on the second insulating layer, and the fourth via hole in the previous embodiment is eliminated in this embodiment; or, it can be understood that the second via hole and the fourth via hole in the foregoing embodiment are via holes in an integrated structure in this embodiment; and The display substrate further includes a second metal layer arranged on the second insulating layer 17. The second metal layer includes a data line Dn, a first power supply voltage line VDD, a first source electrode 18, a first drain electrode 19, a second source electrode 28, a second drain electrode 29, a third source electrode 38, a third drain electrode 39 and a second electrode plate 30, there is a second overlapping region between an orthographic projection of the second electrode plate 30 on the substrate 10 and the orthographic projection of the capacitor electrode plate 14 on the substrate 10, and the second electrode plate 30 acts as another second electrode of the storage capacitor and is configured to form a second storage capacitor with the capacitor electrode plate 14. The first source electrode 18 and the data line Dn are in an integrated structure, the second source electrode 28 and the first power supply voltage line VDD are in an integrated structure, and the second drain electrode 29, the third drain electrode 39 and the second electrode plate 30 are in an integrated structure. The first source electrode 18 is connected with one end of the first active layer 13 through a first via hole V1, the first drain electrode 19 is connected with the other end of the first active layer 13 (which is also the capacitor electrode plate 14) through a via hole in an integrated structure, at the same time, the first drain electrode 19 is connected with the second gate electrode 26 through a third via hole V3. The second source electrode 28 is connected with one end of the second active layer 23 through the fifth via hole V5, and the second drain electrode 29 is connected with the other end of the second active layer 23 through a sixth via hole V6. The third source electrode 38 is connected with one end of the third active layer 33 through the eighth via hole V8 and is connected with the connecting line 40 through the tenth via hole V10 at the same time, and the third drain electrode 39 is connected with the other end of the third active layer 33 through the ninth via hole V9. The second electrode plate 30 is connected with the first electrode plate 11 through the seventh via hole V7.

This embodiment may also increase the capacity of the storage capacitor, facilitate the realization of high-resolution display, and ensure the display quality. In addition, in this embodiment, the capacitor electrode plate and the second active layer are arranged into an integrated structure with the same potential, so that the fourth via hole is eliminated, the etching process of the via hole is simplified, which is beneficial to the realization of high-resolution design. In addition, by forming the capacitor electrode plate and the second active layer which are originally arranged separately into an integrated structure, the area of the capacitor electrode plate is increased, and the capacity of the whole storage capacitor is further improved.

The preparation process of the display substrate in this embodiment may be seen description in the previous embodiment. In this embodiment, the second active layer and the capacitor electrode plate are in an integrated structure in the process of forming patterns of the active layer and the capacitor electrode plate. In the process of forming the pattern of the second insulating layer, there is no need to form a fourth via hole. In the process of forming the pattern of the second metal layer, the second drain electrode is connected with the second active layer only through the second via hole and connected with the first gate electrode through the third via hole, which will not be described in detail here.

Figure 8A:
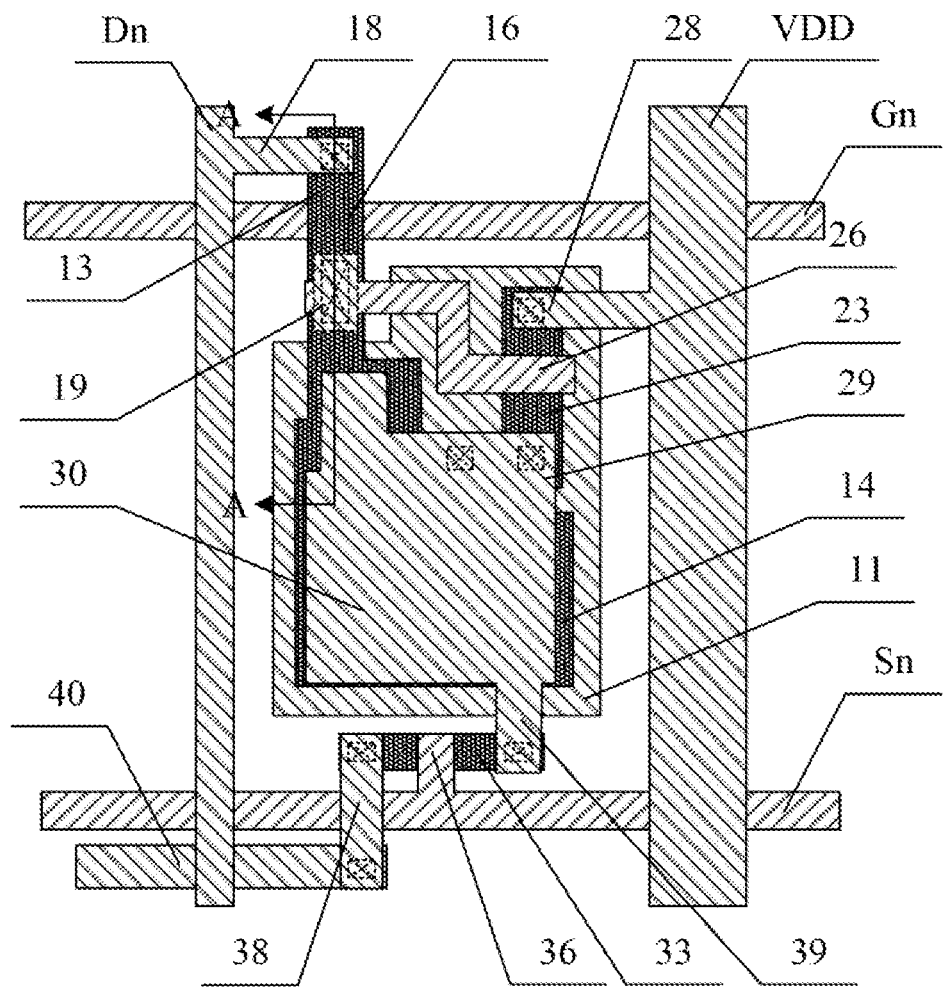
FIG. 8a is a schematic diagram of another exemplary local structure of a display substrate according to an embodiment of the present disclosure.
Figure 8B:
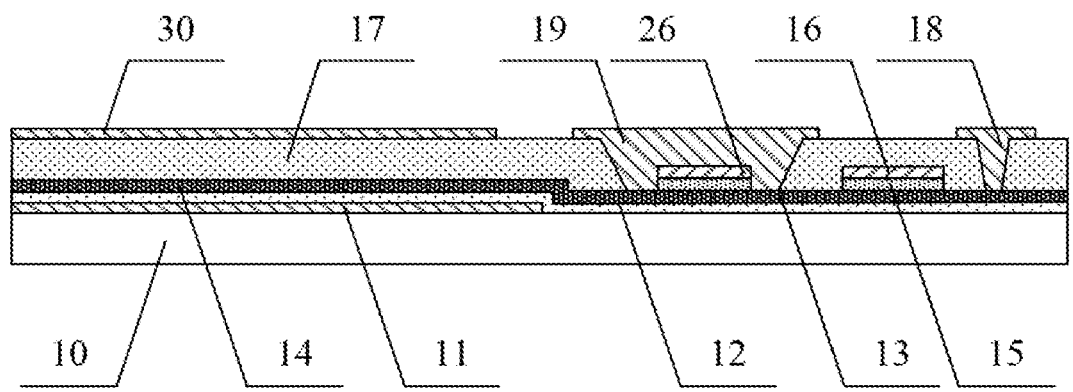

FIG. 8a is a schematic diagram of another exemplary local structure of a display substrate according to an embodiment of the present disclosure, and FIG. 8b is a sectional view taken along A-A in FIG. 8a. This embodiment includes a capacitor electrode plate as the first electrode of storage capacitor, a first electrode plate as a shielding layer and a second electrode of storage capacitor, and a second electrode plate as another second electrode of storage capacitor. A first storage capacitor is formed between the first electrode plate and the capacitor electrode plate. A second storage capacitor is formed between the second electrode plate and the capacitor electrode plate. The first storage capacitor and the second storage capacitor are connected in parallel to form the storage capacitor. As shown in FIG. 8a and FIG. 8b, in this embodiment, not only the capacitor electrode plate 14 and the first active layer 13 may be arranged into an integrated structure, but also a third via hole and a fourth via hole may be eliminated, or it may be understood that the second via hole, the third via hole and the fourth via hole are in an integrated structures. For example, the display substrate of this embodiment includes: a substrate 10, a first electrode plate 11, a connecting wire 40 and a first insulating layer 12, the structure of which may be seen description in the previous embodiments.

The display substrate further includes a metal oxide layer arranged on the first insulating layer 12. The metal oxide layer includes a first active layer 13, a second active layer 23, a third active layer 33 and a capacitor electrode plate 14, the first active layer 13 and the capacitor electrode plate 14 are in an integrated structure, there is a first overlapping region between an orthographic projection of the capacitor electrode plate 14 on the substrate 10 and an orthographic projection of the first electrode plate 11 on the substrate 10, and the capacitor electrode plate 14 acts as the first electrode of the storage capacitor to form a first storage capacitor with the first electrode plate 11.

The display substrate further includes a gate insulating layer 15, and a first scanning line Gn, a second scanning line Sn, a first gate electrode 16, a second gate electrode 26 and a third gate electrode 36 arranged on the gate insulating layer 15. The gate insulating layer 15, the first scanning line Gn, the second scanning line Sn, the first gate electrode 16, the second gate electrode 26 and the third gate electrode 36 have the same pattern, the first gate electrode 16 is in an integrated structure connected with the first scanning line Gn, the third gate electrode 36 is in an integrated structure connected with the second scanning line Sn, and the second gate electrode 26 is broken line shaped.

The display substrate further includes a second insulating layer 17 covering the first scanning line Gn, the second scanning line Sn, the first gate electrode 16, the second gate electrode 26 and the third gate electrode 36. A plurality of via holes are arranged on the second insulating layer respectively, the plurality of via holes include a first via hole V1 exposing one end of the first active layer 13, a second via hole V2 exposing the other end of the first active layer 13 and the second gate electrode 26 at the same time, a fifth via hole V5 and a sixth via hole V6 exposing both ends of the second active layer 23, a seventh via hole V7 exposing the first electrode plate 11, an eighth via hole V8 and the ninth via hole V9 exposing both ends of the third active layer 33, and a tenth via hole V10 exposing the connecting line 40; or it may be understood that the second via hole, the third via hole and the fourth via hole in the foregoing embodiment are via holes in an integrated structure in this embodiment.

The display substrate further includes a second metal layer arranged on the second insulating layer 17. The second metal layer includes a data line Dn, a first power supply voltage line VDD, a first source electrode 18, a first drain electrode 19, a second source electrode 28, a second drain electrode 29, a third source electrode 38, a third drain electrode 39 and a second electrode plate 30, there is a second overlapping region between an orthographic projection of the second electrode plate 30 on the substrate 10 and an orthographic projection of the capacitor electrode plate 14 on the substrate 10, and the second electrode plate 30 acts as another second electrode of the storage capacitor to form a second storage capacitor with the capacitor electrode plate 14. The first source electrode 18 and the data line Dn are in an integrated structure, the second source electrode 28 and the first power supply voltage line VDD are in an integrated structure, and the second drain electrode 29, the third drain electrode 39 and the second electrode plate 30 are in an integrated structure. The first source electrode 18 is connected with one end of the first active layer 13 through the first via hole V1, and the first drain electrode 19 is connected with the other end of the first active layer 13 and the second gate electrode 26 at the same time through a via hole in an integrated structure. The second source electrode 28 is connected with one end of the second active layer 23 through the fifth via hole V5, and the second drain electrode 29 is connected with the other end of the second active layer 23 through the sixth via hole V6. The third source electrode 38 is connected with one end of the third active layer 33 through the eighth via hole V8 and is connected with the connecting line 40 through the tenth via hole V10 at the same time, and the third drain electrode 39 is connected with the other end of the third active layer 33 through the ninth via hole V9. The second electrode plate 30 is connected with the first electrode plate 11 through the seventh via hole V7.

This embodiment may also increase the capacity of the storage capacitor, facilitate the realization of high-resolution display, and ensure the display quality. In addition, in this embodiment, by arranging the capacitor electrode plate and the second active layer into an integrated structure and have the same potential, the third via hole and the fourth via hole are eliminated, and only the second via hole is reserved. The second drain electrode is connected with the second active layer and the first gate electrode at the same time through the second via hole, which not only simplifies the process and facilitates the realization of high-resolution design, but also increases the area of the capacitor electrode plate and the second metal layer by forming the originally separated capacitor electrode plate and the second active layer into an integrated structure, further increasing the capacity of the whole storage capacitor.

The preparation process of the display substrate in this embodiment may be seen description in the previous embodiment. In this embodiment, the second active layer and the capacitor electrode plate are in an integrated structure in the process of forming the active layer and the capacitor electrode plate pattern. In the process of forming the pattern of the second insulating layer, a via hole in an integrated structure exposing the second active layer and the first gate electrode at the same time is formed. In the process of forming patterns of the source/drain electrode and the second metal layer, the second drain electrode is connected with the second active layer and the first gate electrode simultaneously through the via hole in an integrated structure, which will not be repeated here.

Figure 9A:
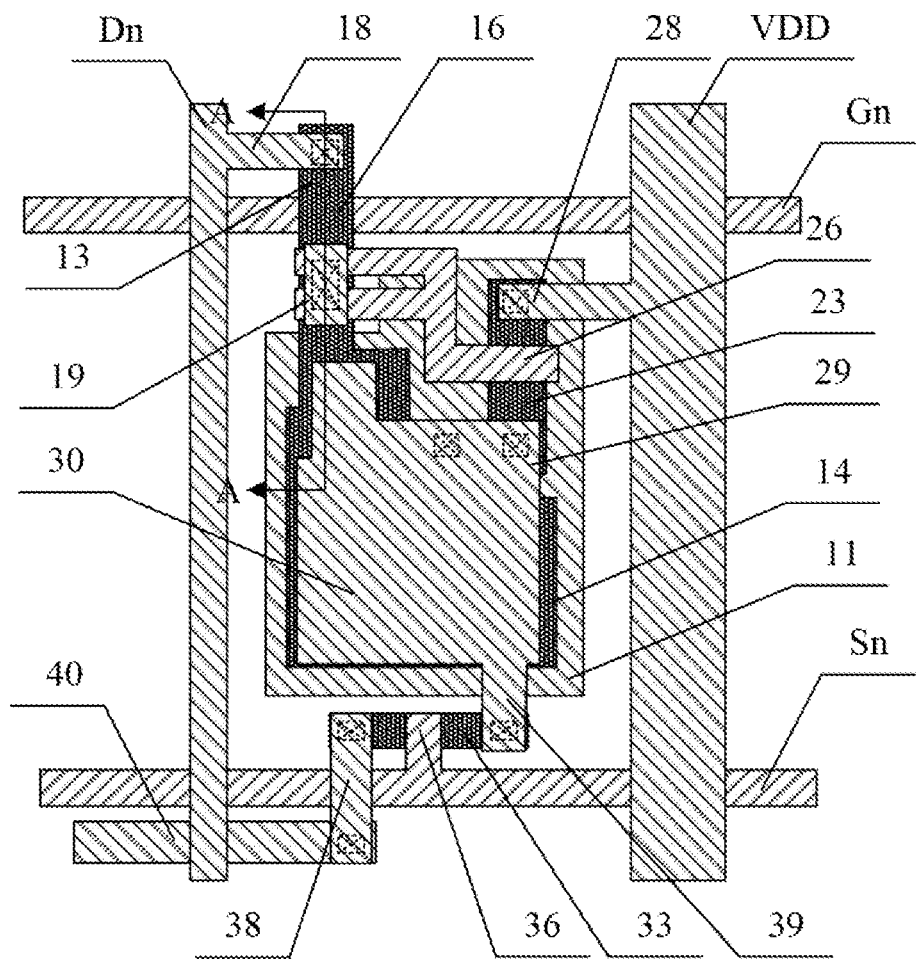
FIG. 9a is a schematic diagram of another exemplary local structure of a display substrate according to an embodiment of the present disclosure.
Figure 9B:
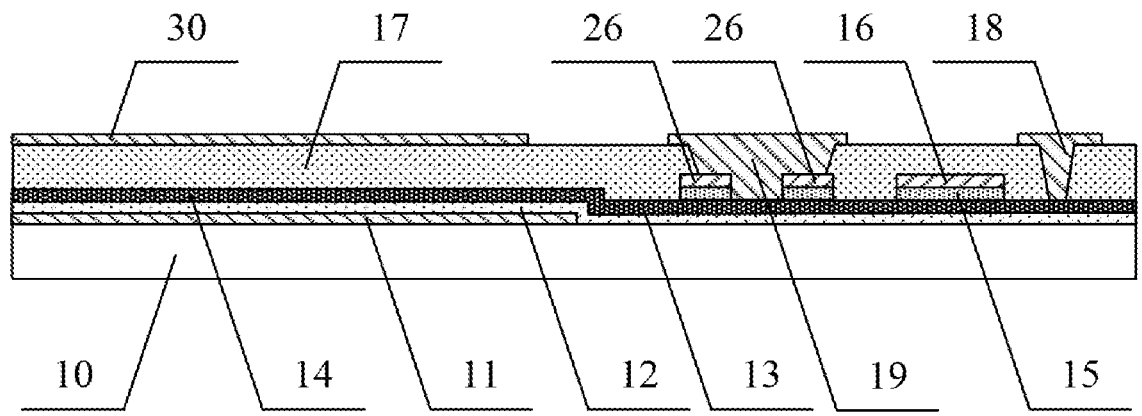

FIG. 9*a* is a schematic diagram of an exemplary local structure of another display substrate according to an embodiment of the present disclosure, and FIG. 9*b* is a sectional view taken along A-A in FIG. 9*a*. As shown in FIG. 9*a* and FIG. 9*b*, in this embodiment, two second gate electrodes 26 are formed at a position of a first drain electrode 19. For example, in this embodiment, the second gate electrode 26 is broken line shaped, and two second gate electrodes 26 are formed at a position of a second transistor. Two second gate electrodes 26 and a first active layer 13 are exposed at the same time through a via hole in an integrated structure arranged on a second insulating layer 17, and the first drain electrode 19 is connected with the first active layer 13 and two second gate electrodes 26 at the same time through the via hole in an integrated structure. The via hole in an integrated structure exposes a first active layer 13 in a region between the two second gate electrodes 26, and simultaneously exposes the second gate electrodes 26 of a part in which the two second gate electrodes 26 are adjacent to each other.

This embodiment may also increase the capacity of the storage capacitor, facilitate the realization of high-resolution display, and ensure the display quality. In addition, by arranging two first gate electrodes, the size of the second via hole is reduced, the connection reliability is increased, and the high-resolution design is further facilitated.

The preparation process of the display substrate in this embodiment may be seen description in the previous embodiment. In this embodiment, two first gate electrodes are formed at the position of the second drain electrode in the process of forming patterns such as scanning lines, so they will not be described in detail here.

Figure 10A:
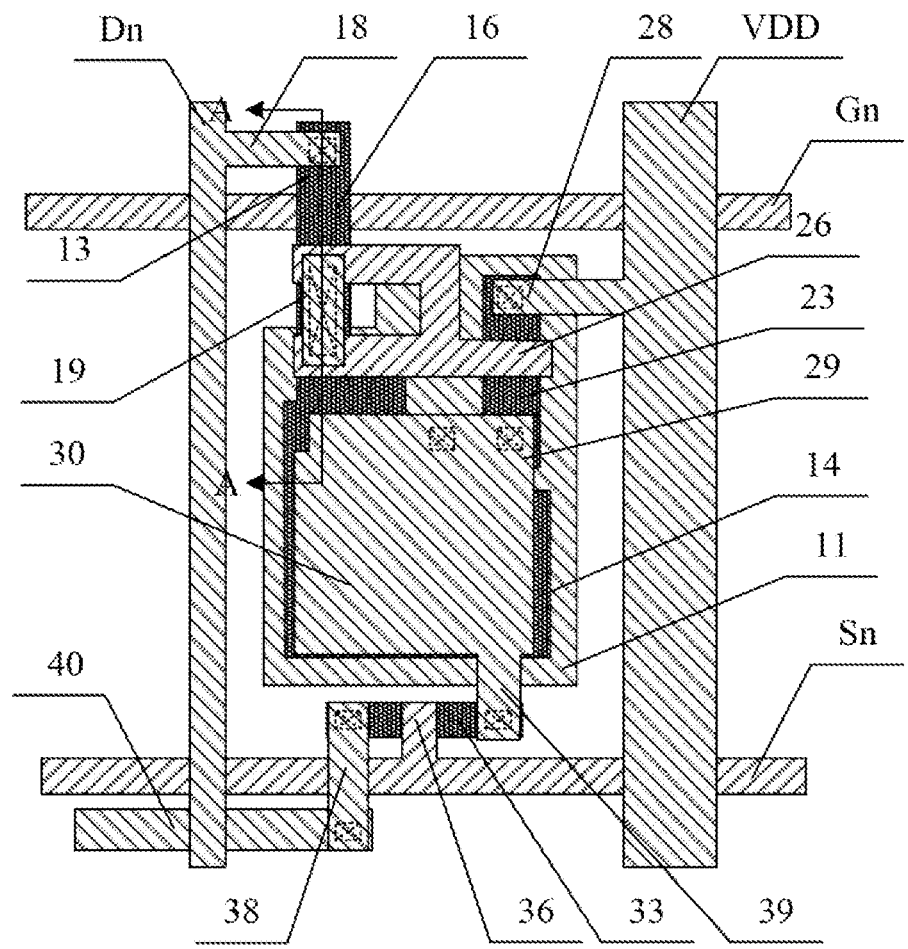
FIG. 10a is a schematic diagram of another exemplary local structure of a display substrate according to an embodiment of the present disclosure.
Figure 10B:
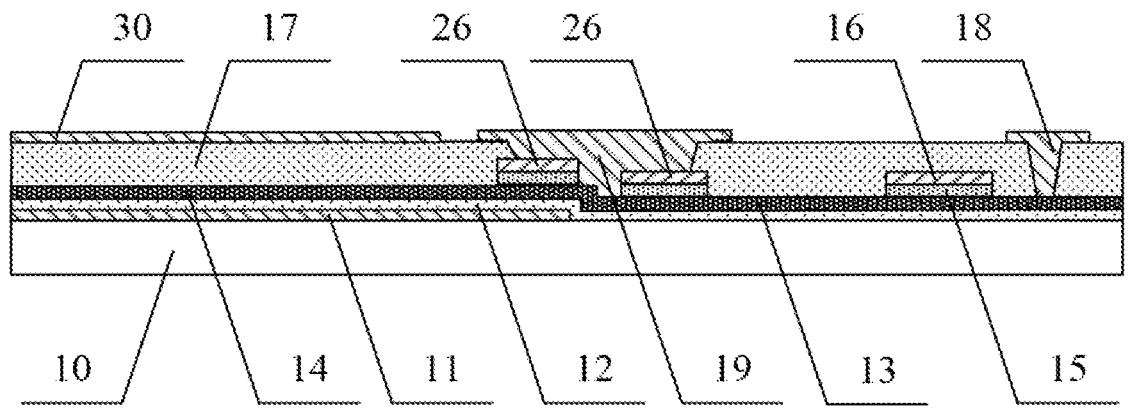

FIG. 10*a* is a schematic diagram of another exemplary local structure of a display substrate according to an embodiment of the present disclosure, and FIG. 10*b* is a sectional view taken along A-A in FIG. 10*a*. As shown in FIG. 10*a* and FIG. 10*b*, positions at which two second gate electrodes 26 are arranged are different in this embodiment, and the two second gate electrodes 26 are respectively arranged on both sides of a step formed by a first electrode plate 11. For example, in this embodiment, the second gate electrode 26 is broken line shaped. Two second gate electrodes 26 are formed at a position of a second transistor, one second gate electrode 26 is located on the step formed by the first electrode plate 11, and the other second gate electrode 26 is located under the step. A via hole of integrated structure arranged on a second insulating layer 17 simultaneously exposes the two second gate electrodes 26 and a first active layer 13 between the two second gate electrodes 26. A first drain electrode 19 is connected with the first active layer 13 and two second gate electrodes 26 through a via hole in an integrated structure.

This embodiment may also increase the capacity of the storage capacitor, facilitate the realization of high-resolution display, and ensure the display quality. In addition, in this embodiment, two first gate electrodes are respectively arranged on both sides of the step formed by a first metal layer, which may effectively prevent the failure caused by the fracture of the second active layer at the step, and improve the connection reliability. For example, since the first gate electrodes connected with the second drain electrode are both arranged on the step and under the step, even if the second active layer breaks at the step, it may be ensured that the second active layer and the capacitor electrode plate have the same potential.

The preparation process of the display substrate in this embodiment may be seen description in the previous embodiment. In this embodiment, the positions of the two first gate electrodes formed at the second drain electrode are different in the process of forming patterns such as scanning lines, so they will not be described in detail here.

Figure 11:
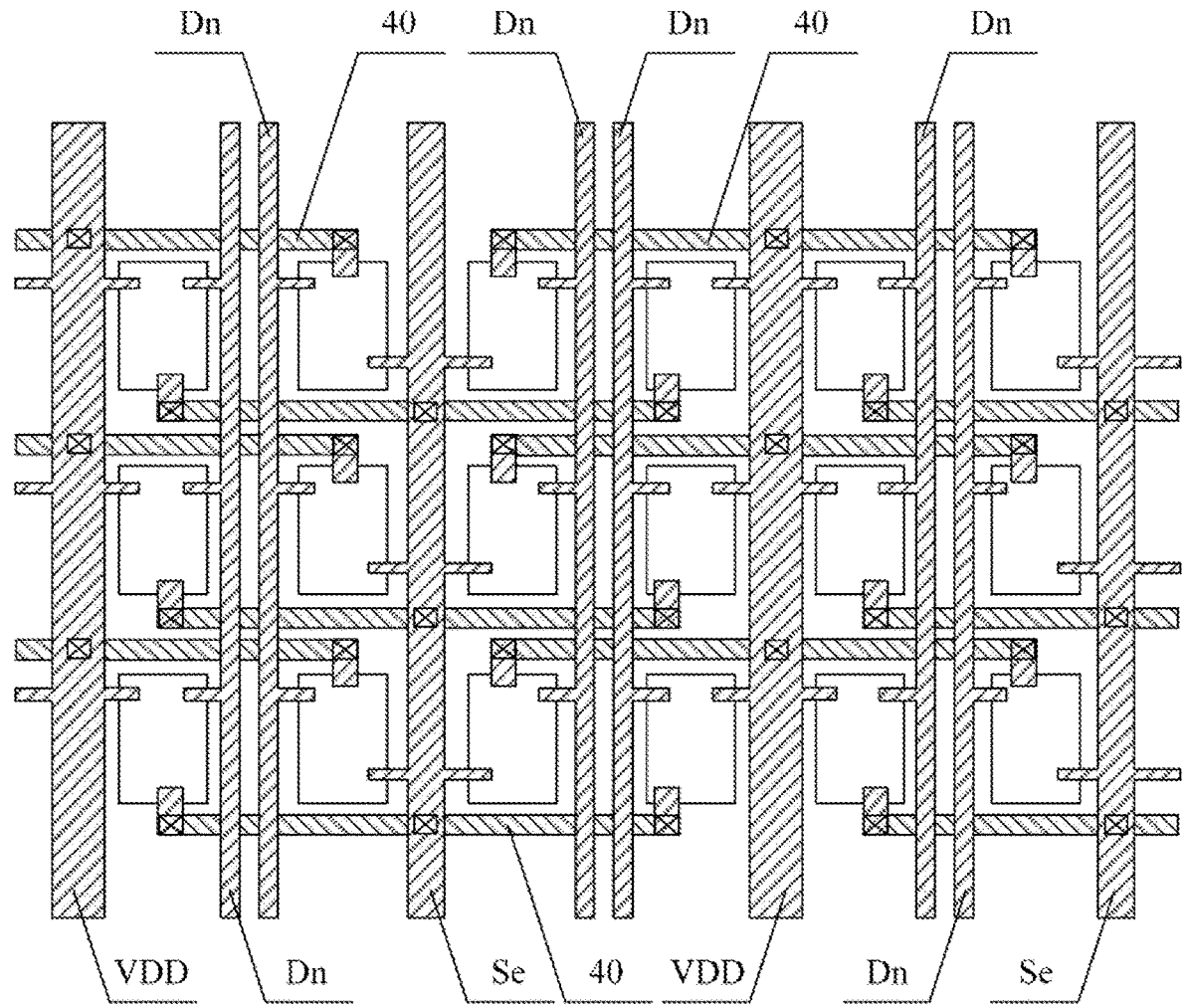
FIG. 11 is a whole layout diagram of a display substrate according to an embodiment of the present disclosure.

FIG. 11 is a whole layout diagram of a display substrate according to an embodiment of the present disclosure. As shown in FIG. 11, a first power supply voltage line VDD, two data lines Dn and a compensation line Se of the display substrate are parallel to each other and arranged in sequence. A pixel column is formed between the first power supply voltage line VDD and adjacent data line Dn, and another pixel column is formed between the compensation line Se and adjacent data line Dn. In this way, four pixel columns are formed by arranging one compensation line Se and four data lines Dn between adjacent first power supply voltage lines VDD. Two of the four data lines Dn are located on one side of the compensation line Se and the other two data lines Dn are located on the other side of the compensation line Se. In the same way, four pixel columns are also formed by arranging one first power supply voltage line VDD and four data lines Dn between adjacent compensation lines Se. In the four data lines Dn, two data lines Dn are located on one side of the first power supply voltage line VDD and the other two data lines Dn are located on the other side of the first power supply voltage line VDD.

In the embodiment of the present disclosure, both the first power supply voltage line VDD and the compensation line Se adopt a one-to-four structure. In an exemplary embodiment, the display substrate further includes a plurality of connecting lines 40, wherein the connecting lines 40 and a shielding layer of the display substrate (which is also a first electrode plate of a second electrode of a storage capacitor) are arranged in the same layer and formed by the same patterning process. The connecting lines 40 are perpendicular to the first power supply voltage line VDD (compensation line Se). The plurality of connecting lines 40 connected with the first power supply voltage line VDD through via holes are respectively electrically connected with pixels of pixel columns between the compensation line Se and the data line Dn on both sides of the first power supply voltage line VDD. Since the first power supply voltage line VDD is directly electrically connected with the pixels in the pixel columns on both sides of the first power supply voltage line VDD, one first power supply voltage line VDD may provide signals to pixels of four pixel columns. In the same way, the plurality of connecting lines 40 connected with the compensation line Se through via holes are respectively electrically connected with the pixels of the pixel column between the first power supply voltage line VDD and the data line Dn on both sides of the compensation line Se. Since the compensation line Se is directly electrically connected with the pixels of the pixel column on both sides of the compensation line Se, one compensation line Se may provide signals to pixels of four pixel columns.

According to the display substrate of the embodiment of the present disclosure, by designing the first power supply voltage line and the compensation line into a one-to-four structure, the size of each pixel is effectively increased under the same resolution, and the display substrate has the advantages of making full use of layout space, reasonable overall layout and the like.

An embodiment of the present disclosure further provides a display device, including the display substrate described above. The display device may be any product or component with a display function such as a mobile phone, a tablet computer, a television, a display, a notebook computer, a digital photo frame, a navigator, etc.

In the description of the Implementations of the present disclosure, the terms "installed", "connected" and "coupled" shall be broadly understood unless otherwise explicitly specified and defined. For example, it may be fixedly connected, or may be removable connected, or integrally connected; it may be mechanically connected, or may be electrically connected; it may be directly connected, or may be indirectly connected through middleware, or may be internal connection between two elements. Those of ordinary skill in the art can understand the specific meanings of the above mentioned terms in the present disclosure according to specific situations.

Although implementations disclosed in the present disclosure are as the above, the described contents are only implementations used for facilitating understanding the present disclosure, and are not used to limit the present disclosure. Any person skilled in the art to which the present disclosure pertains may perform any modifications and variations in the form and details of implementation without departing from the spirit and the scope of the present disclosure, but the patent protection scope of the present disclosure shall still be subject to the scope defined in the appended claims.

The invention claimed is:

1. A display substrate, comprising a substrate and a plurality of sub-pixels corresponding to different colors arranged on the substrate, wherein each sub-pixel comprises a pixel driving circuit and an organic electroluminescent diode electrically connected with the pixel driving circuit; wherein
   the pixel driving circuit comprises a first transistor, a second transistor and a storage capacitor, a gate electrode of the first transistor is coupled to a first scanning line, a first electrode of the first transistor is coupled to a data line, and a second electrode of the first transistor is coupled to a gate electrode of the second transistor; a first electrode of the second transistor is coupled to a first power supply voltage line, a second electrode of the second transistor is coupled to a first electrode of the organic electroluminescent diode, and a second electrode of the organic electroluminescent diode is coupled to a second power supply voltage line; a first electrode of the storage capacitor is coupled to the gate electrode of the second transistor, a second electrode of the storage capacitor is coupled to the second electrode of the second transistor;
   in a direction perpendicular to the substrate, the display substrate comprises a first metal layer, a first insulating layer, a metal oxide layer, a second insulating layer and a second metal layer which are stacked;
   the metal oxide layer comprises a first pattern as an active layer of the first transistor, a second pattern as an active layer of the second transistor and a capacitor pattern as the first electrode of the storage capacitor; and the metal oxide layer comprises gallium;
   the first pattern, the second pattern and the capacitor pattern are disposed in the same layer, and the first pattern and the capacitor pattern are in an integral structure;
   the first metal layer comprises a first electrode plate, and there is at least a first overlapping region between an orthographic projection of the first electrode plate on the substrate and an orthographic projection of the capacitor pattern on the substrate to form the first storage capacitor;
   the second metal layer comprises a second electrode plate, and there is at least a second overlapping region between an orthographic projection of the second electrode plate on the substrate and the orthographic projection of the capacitor pattern on the substrate to form a second storage capacitor; and
   the first electrode plate and the second electrode plate have same potential.

2. The display substrate of claim 1, wherein there is an overlapping region between an orthographic projection of the second pattern on the substrate and the orthographic projection of the first electrode plate on the substrate.

3. The display substrate of claim 1, further comprising a gate insulating layer between the first insulating layer and the second insulating layer, wherein a thickness of the gate insulating layer is less than a thickness of the second insulating layer.

4. The display substrate of claim 3, wherein a thickness of the first insulating layer is less than a sum of thicknesses of the gate insulating layer and the second insulating layer.

5. The display substrate of claim 1, further comprising a gate metal layer between the first metal layer and the second metal layer, wherein a thickness of the second metal layer is greater than a thickness of the gate metal layer.

6. The display substrate of claim 1, wherein a channel aspect ratio of the first transistor is less than a channel aspect ratio of the second transistor.

7. The display substrate of claim 1, wherein a voltage of the first power supply voltage line is greater than a voltage of the second power supply voltage line, a maximum voltage of the data line is less than a maximum voltage of the first scanning line, and the maximum voltage of the data line is less than the voltage of the first power supply voltage line.

8. The display substrate of claim 1, wherein an orthographic projection of the first pattern on the substrate and the orthographic projection of the capacitor pattern on the substrate are arranged apart, and the orthographic projection of the first pattern on the substrate and the orthographic projection of the first electrode plate on the substrate are arranged apart.

9. The display substrate of claim 1, wherein the pixel driving circuit further comprises a third transistor, wherein a gate electrode of the third transistor is coupled to a second scanning line, a first electrode of the third transistor is connected with a compensation line, and a second electrode of the third transistor is coupled to the second electrode of the second transistor.

10. The display substrate of claim 9, wherein the metal oxide layer further comprises a third pattern as an active layer of the third transistor.

11. The display substrate of claim 10, wherein the second insulating layer covers the first scanning line, the second scanning line, the gate electrode of the first transistor, the gate electrode of the second transistor and the gate electrode of the third transistor; and a plurality of via holes are arranged on the second insulating layer respectively.

12. The display substrate of claim 11, wherein the second metal layer further comprises the data line, the first power supply voltage line, a source electrode of the first transistor, a drain electrode of the first transistor, a source electrode of the second transistor, a drain electrode of the second transistor, a source electrode of the third transistor, and a drain electrode of the third transistor.

13. The display substrate of claim 12, wherein the source electrode of the first transistor and the data line are in an integrated structure, the source electrode of the second transistor and the first power supply voltage line are in an integrated structure, and the drain electrode of the second transistor, the drain electrode of the third transistor and the second electrode plate are in an integrated structure.

14. The display substrate of claim 13, wherein the capacitor pattern, the active layer of the first transistor, the active layer of the second transistor and the active layer of the third transistor are arranged in a same layer, made of a same material and formed by a same patterning process.

15. The display substrate of claim 14, wherein the second electrode plate, the data line, the first power supply voltage line, the first source electrode, the drain electrode of the first transistor, the source electrode of the second transistor, the drain electrode of the second transistor, the source electrode of the third transistor and the drain electrode of the third transistor are arranged in a same layer, made of a same material and formed by a same patterning process.

16. The display substrate of claim 1, wherein the metal oxide layer is a single layer, a double layer or a plurality of layers.

17. The display substrate of claim 16, wherein the metal oxide layer comprises a first oxide layer and a second oxide layer stacked, wherein conductivity of the second oxide layer is lower than that of the first oxide layer, and a band gap of the second oxide layer is greater than that of the first oxide layer.

18. The display substrate of claim 17, wherein the first oxide layer is configured to be close to the gate electrodes of the first transistor, the second transistor and the third transistor.

19. A display device, comprising the display substrate of claim 1.

* * * * *